(12) United States Patent
Park

(10) Patent No.: US 11,476,194 B2
(45) Date of Patent: Oct. 18, 2022

(54) METHOD FOR FABRICATING SEMICONDUCTOR DEVICE

(71) Applicant: SAMSUNG ELECTRONICS CO., LTD., Suwon-si (KR)

(72) Inventor: Seok Han Park, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/316,798

(22) Filed: May 11, 2021

(65) Prior Publication Data

US 2021/0265270 A1 Aug. 26, 2021

Related U.S. Application Data

(63) Continuation of application No. 16/528,839, filed on Aug. 1, 2019, now Pat. No. 11,031,338.

(30) Foreign Application Priority Data

Dec. 24, 2018 (KR) .................. 10-2018-0168294

(51) Int. Cl.
*H01L 23/528* (2006.01)
*H01L 21/768* (2006.01)
*H01L 23/532* (2006.01)
*H01L 23/522* (2006.01)
*H01L 21/311* (2006.01)

(52) U.S. Cl.
CPC .... *H01L 23/5283* (2013.01); *H01L 21/31144* (2013.01); *H01L 21/7682* (2013.01); *H01L 21/76808* (2013.01); *H01L 21/76813* (2013.01); *H01L 23/5226* (2013.01); *H01L 23/53295* (2013.01)

(58) Field of Classification Search
CPC .......... H01L 23/5283; H01L 21/31144; H01L 21/76808; H01L 21/76813; H01L 23/6226; H01L 23/53295; H01L 23/5222
USPC ........................ 438/0.622, 118; 257/774.713
See application file for complete search history.

(56) References Cited

U.S. PATENT DOCUMENTS 6,333,255 B1 12/2001 Sekiguchi
6,555,467 B2 4/2003 Hsu et al.
(Continued)

FOREIGN PATENT DOCUMENTS

JP 2006-019401 A 1/2006
JP 2013-105986 A 5/2013
(Continued)

*Primary Examiner* — Thinh T Nguyen
(74) *Attorney, Agent, or Firm* — Lee IP Law, P.C.

(57) ABSTRACT

A semiconductor device includes a first interlayer insulating film on a substrate, a via which penetrates the first interlayer insulating film, a first etching stop film which extends along an upper surface of the first interlayer insulating film, a second interlayer insulating film on the first etching stop film, the second interlayer insulating film including a plurality of periodically arranged air gaps, a first wiring pattern in the second interlayer insulating film, the first wiring pattern penetrating the first etching stop film and is connected to the via, and a capping film which covers an upper surface of the second interlayer insulating film and an upper surface of the first wiring pattern, each of the plurality of air gaps in the second interlayer insulating film extending from the first etching stop film to the capping film.

20 Claims, 37 Drawing Sheets

(56) References Cited

U.S. PATENT DOCUMENTS

| | | | |
|---|---|---|---|
| 6,815,329 | B2 | 11/2004 | Babich et al. |
| 6,930,034 | B2 | 8/2005 | Colburn et al. |
| 7,084,479 | B2 | 8/2006 | Chen et al. |
| 7,884,477 | B2 | 2/2011 | Bonilla et al. |
| 2003/0064577 | A1 | 4/2003 | Hsu et al. |
| 2011/0084357 | A1 | 4/2011 | Liu et al. |
| 2011/0092067 | A1* | 4/2011 | Bonilla et al. .... H01L 23/53238 438/627 |
| 2016/0027726 | A1 | 1/2016 | Zhu et al. |
| 2016/0351440 | A1 | 12/2016 | Tsuchiya |

FOREIGN PATENT DOCUMENTS

| | | |
|---|---|---|
| JP | 2014-175525 A | 9/2014 |
| KR | 10-0304051 B1 | 7/2001 |

* cited by examiner

FIG. 1A
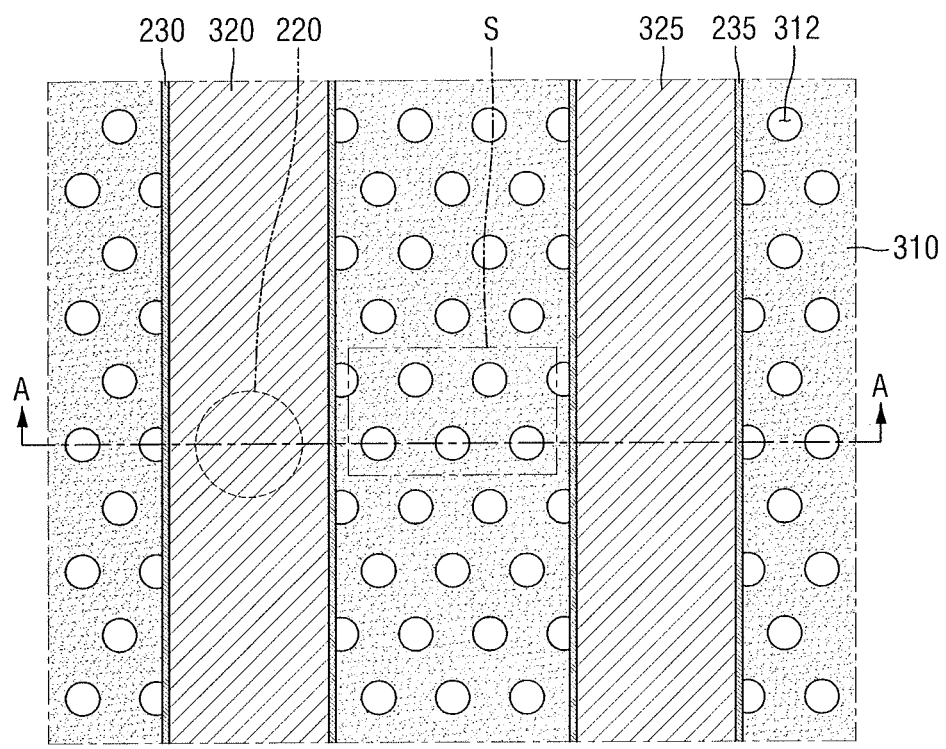
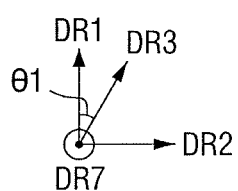

METHOD FOR FABRICATING SEMICONDUCTOR DEVICE

CROSS-REFERENCE TO RELATED APPLICATION

This application is a continuation of U.S. patent application Ser. No. 16/528,839, filed Aug. 1, 2019, which is incorporated by reference herein in its entirety Korean Patent Application No. 10-2018-0168294, filed on Dec. 24, 2018, in the Korean Intellectual Property Office, and entitled: "Semiconductor Device and Method for Fabricating the Same," is incorporated by reference herein in its entirety.

BACKGROUND

1. Field

Embodiments relate to a semiconductor device and a method for fabricating the same. More specifically, embodiments relate to a semiconductor device including an air gap in an interlayer insulating film and a method for fabricating the same.

2. Description of the Related Art

As down-scaling of the semiconductor device has rapidly advanced due to the development of electronic technology in recent years, a higher integration and a lower power consumption of the semiconductor device have been required. In order to cope with such a requirement, copper having low resistance and excellent electromigration resistance may be used as a wiring material of the semiconductor device.

The wiring using the copper may be formed by a damascene process. For example, the dual damascene process of forming a via hole and a trench in an interlayer insulating film and burying copper in the formed via hole and the trench to form a wiring may be used for forming a copper wiring.

SUMMARY

According to embodiments, there is provided a semiconductor device including a first interlayer insulating film on a substrate, a via which penetrates the first interlayer insulating film, a first etching stop film which extends along an upper surface of the first interlayer insulating film, a second interlayer insulating film on the first etching stop film, the second interlayer insulating film including a plurality of periodically arranged air gaps, a first wiring pattern in the second interlayer insulating film, the first wiring pattern penetrating the first etching stop film and is connected to the via, and a capping film which covers an upper surface of the second interlayer insulating film and an upper surface of the first wiring pattern, each of the plurality of air gaps in the second interlayer insulating film extending from the first etching stop film to the capping film.

According to embodiments, there is provided a semiconductor device including a first interlayer insulating film on a substrate, a first via penetrating the first interlayer insulating film, a first etching stop film extending along an upper surface of the first interlayer insulating film, a second interlayer insulating film on the first etching stop film, a first wiring pattern penetrating the first etching stop film and connected to the first via, in the second interlayer insulating film, and a first capping film which covers an upper surface of the second interlayer insulating film and an upper surface of the first wiring pattern, wherein the second interlayer insulating film includes first to third air gaps each extending from the first etching stop film to the first capping film, and a spaced distance between the first air gap and the second air gap is equal to a spaced distance between the second air gap and the third air gap.

According to embodiments, there is provided a semiconductor device including a first etching stop film on a substrate, a first interlayer insulating film on the first etching stop film, a capping film which covers an upper surface of the first interlayer insulating film, and a first wiring pattern extending from the first etching stop film to the capping film, in the first interlayer insulating film, wherein the first interlayer insulating film includes a plurality of air gaps arranged in a honeycomb structure from a planar viewpoint.

According to embodiments, there is provided a method for fabricating a semiconductor device, the method including sequentially forming a first interlayer insulating film, a first wiring pattern in the first interlayer insulating film, a first etching stop film on the first interlayer insulating film, and a second interlayer insulating film on the first etching stop film, on a substrate, forming a via and a first wiring pattern, the via penetrating the first interlayer insulating film, and the first wiring pattern penetrating the first etching stop film and the second interlayer insulating film and connected to the via, forming a plurality of air gaps periodically arranged in the second interlayer insulating film, and forming a capping film which covers an upper surface of the second interlayer insulating film and an upper surface of the first wiring pattern, and defines an upper part of each of the air gaps.

BRIEF DESCRIPTION OF THE DRAWINGS

Features will become apparent to those of skill in the art by describing in detail exemplary embodiments with reference to the attached drawings, in which:

FIG. 1A illustrates a layout diagram of a semiconductor device according to some embodiments.

DETAILED DESCRIPTION

Hereinafter, a semiconductor device according to some embodiments will be described with reference to FIGS. 1A to 4B.

Figure 1B:
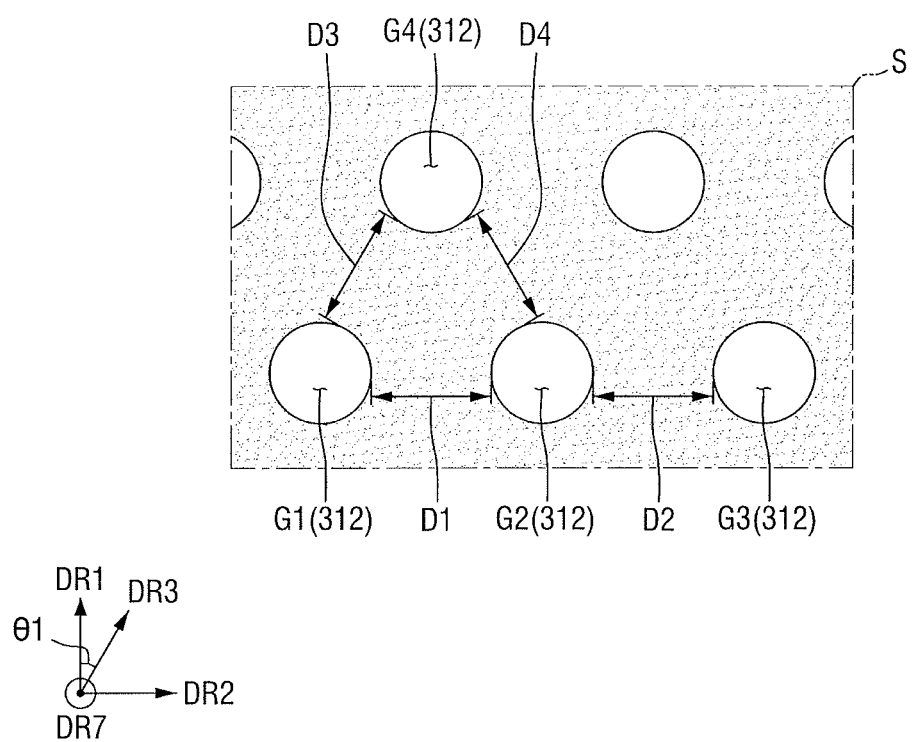
FIG. 1B illustrates an enlarged view of a region S in FIG. 1A.
Figure 2:
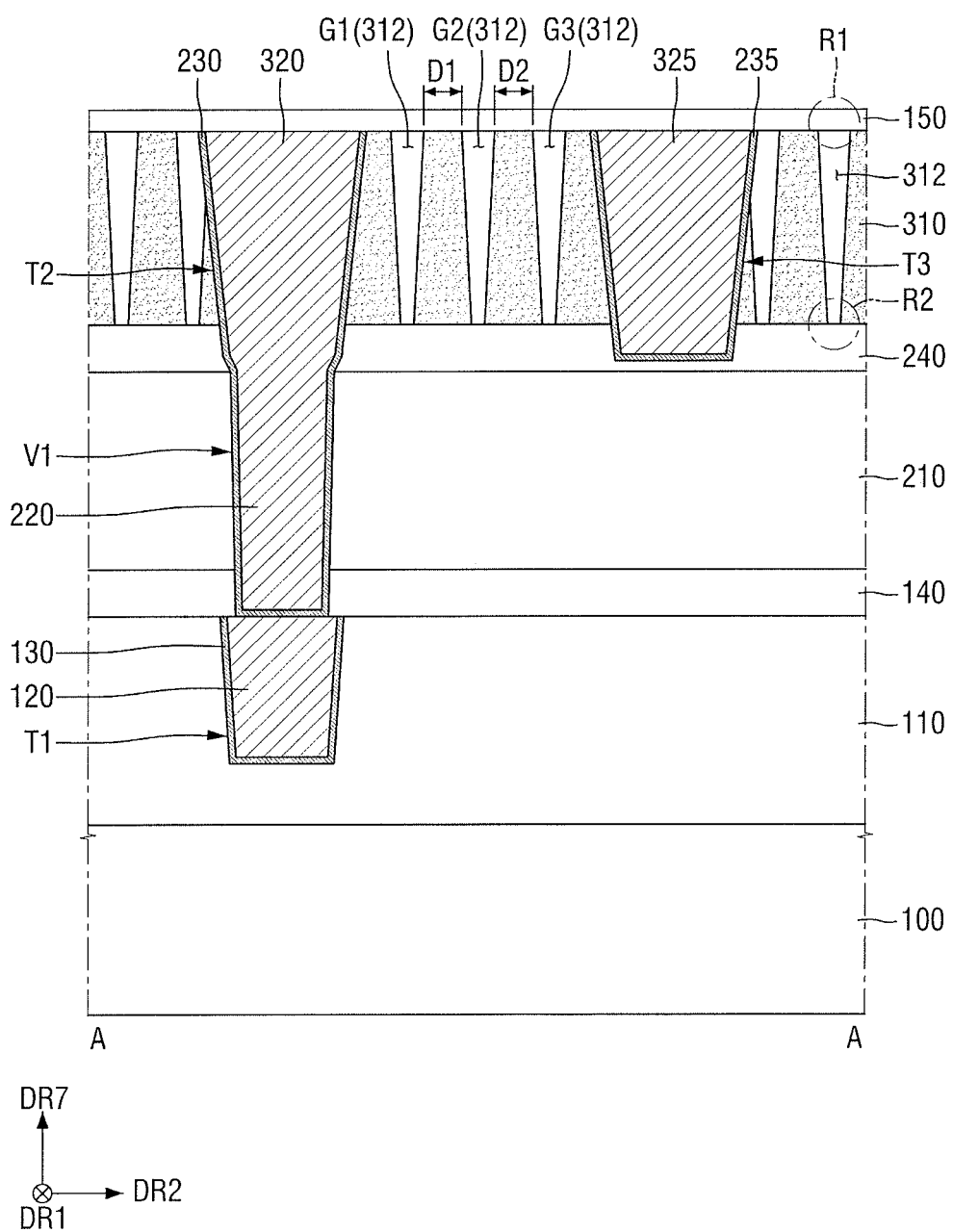
FIG. 2 is a cross-sectional view taken along line A-A of FIG. 1A.
Figure 3A:
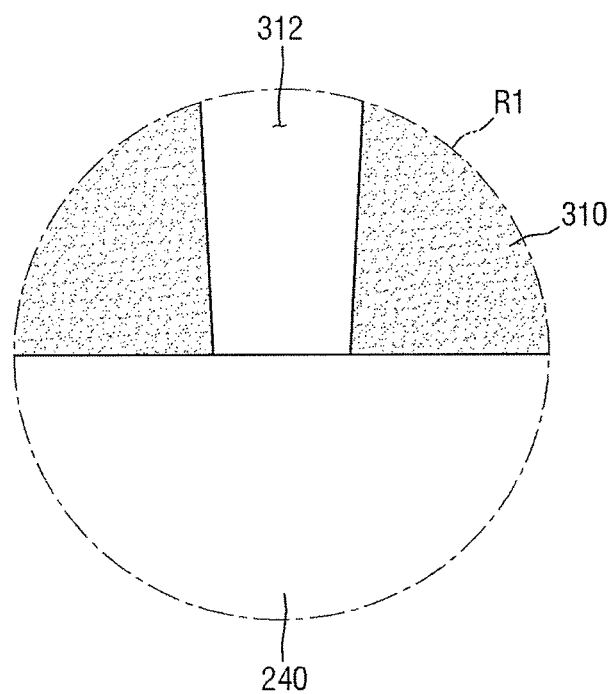
FIGS. 3A and 3B illustrate various enlarged views of a region R1 in FIG. 2.
Figure 3B:
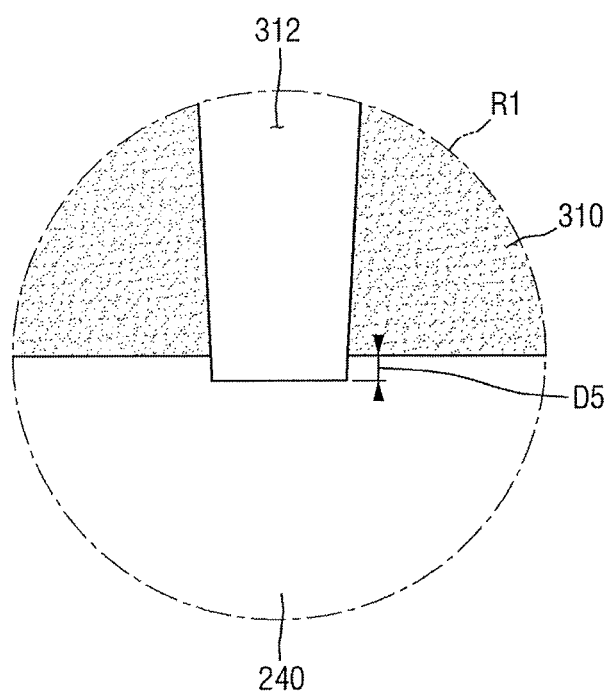
Figure 4A:
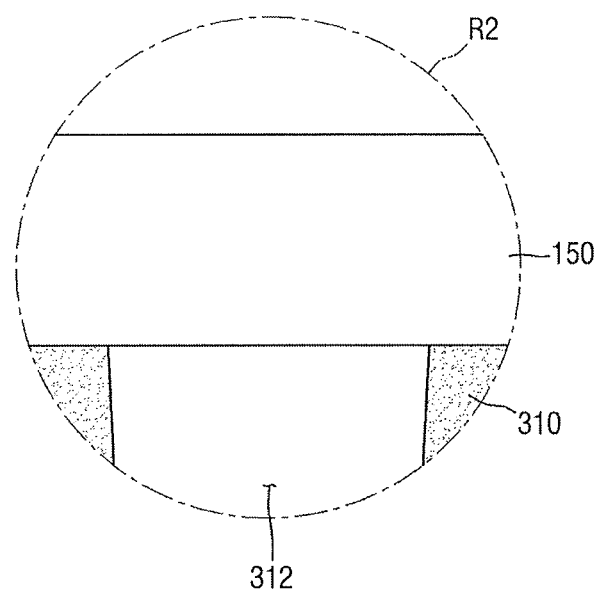
FIGS. 4A and 4B illustrate various enlarged views of a region R2 of FIG. 2.
Figure 4B:
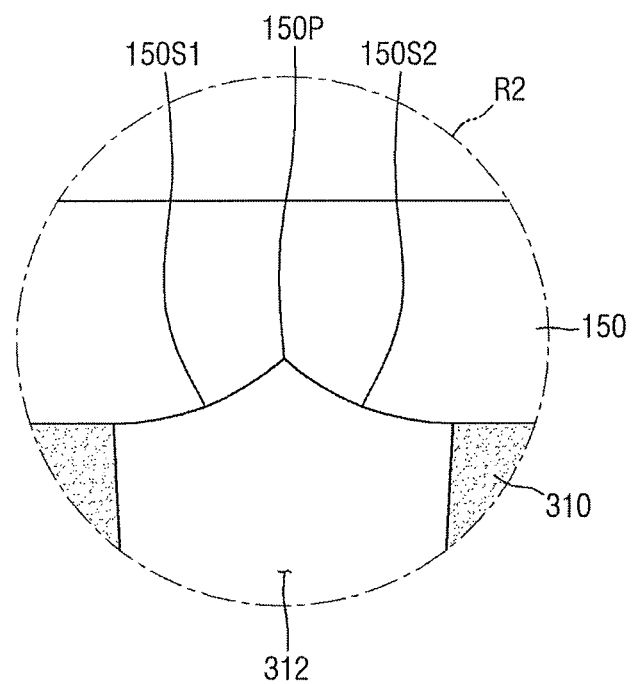

FIG. 1A is a top layout diagram for explaining a semiconductor device according to some embodiments. FIG. 1B is an enlarged view of a region S of FIG. 1A. FIG. 2 is a cross-sectional view taken along line A-A of FIG. 1A. FIGS. 3A and 3B are various enlarged views illustrating a region R1 of FIG. 2. FIGS. 4A and 4B are various enlarged views illustrating a region R2 of FIG. 2.

Referring to FIGS. 1A to 4B, the semiconductor device according to some embodiments may include a substrate 100, a first interlayer insulating film 110, a first wiring pattern 120, a first etching stop film 140, a second interlayer insulating film 210, a first via 220, a second etching stop film 240, a third interlayer insulating film 310, a second wiring pattern 320, a third wiring pattern 325, and a first capping film 150.

For example, the substrate 100 may be bulk silicon or silicon-on-insulator (SOI). In another example, the substrate 100 may be a silicon substrate or may include other material, e.g., silicon germanium, silicon germanium on insulator (SGOI), indium antimonide, lead tellurium compound, indium arsenide, indium phosphide, gallium arsenide or gallium antimonide.

The substrate 100 may include various internal circuit elements. The internal circuit element may include an active element, e.g., a transistor, or a passive element, e.g., a resistor or a capacitor.

The first interlayer insulating film 110 may be formed on the substrate 100. The first interlayer insulating film 110 is formed in a state of being formed just above the substrate 100, but this is only for convenience of explanation. For example, another interlayer insulating film and/or wiring pattern may be interposed between the substrate 100 and the first interlayer insulating film 110.

The first interlayer insulating film 110 may include at least one of, e.g., silicon oxide, silicon nitride, silicon oxynitride, a low dielectric constant material having a lower dielectric constant than silicon oxide, and combinations thereof. The low dielectric constant material may include, e.g., at least one of FOX (Flowable Oxide), TOSZ (Torene SilaZene), USG (Undoped Silica Glass), BSG (Borosilica Glass), PSG (PhosphoSilica Glass), BPSG (BoroPhospho Silica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and combinations thereof.

The first wiring pattern 120 may be formed in the first interlayer insulating film 110, e.g., to a predetermined depth in the first interlayer insulating film 110 along a seventh direction DR7. For example, the first interlayer insulating film 110 may include a first trench T1 extending in a first direction DR1 (i.e., into the page in FIG. 2) and a depth extending in the seventh direction DR7. The first direction DR1 may be a direction parallel to an upper surface of the substrate 100, and the seventh direction DR7 may be a direction that is perpendicular to the upper surface of the substrate 100. The first wiring pattern 120 may fill the first trench T1 of the first interlayer insulating film 110. As a result, the first wiring pattern 120 may extend long in the first interlayer insulating film 110.

The first wiring pattern 120 may be connected to various internal circuit elements in the substrate 100. As a result, the first wiring pattern 120 may be used to configure a circuit of the semiconductor device according to some embodiments.

The first wiring pattern 120 may include a conductive material. For example, the first wiring pattern 120 may include metals, e.g., tungsten (W), titanium (Ti), tantalum (Ta), copper (Cu), and aluminum (Al). For convenience of explanation, the first wiring pattern 120 will be described as containing copper (Cu) below.

In some embodiments, a first barrier conductive film 130 may be interposed between the first interlayer insulating film 110 and the first wiring pattern 120. For example, the first barrier conductive film 130 may extend, e.g., conformally, along the sidewalls and the bottom surface of the first trench T1.

The first barrier conductive film 130 prevents elements (e.g., copper (Cu)) contained in the first wiring pattern 120 from diffusing to the first interlayer insulating film 110 or the like. The first barrier conductive film 130 may include, e.g., at least one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN) and combinations thereof.

The first etching stop film 140 may be formed on the first interlayer insulating film 110 and the first wiring pattern 120. For example, the first etching stop film 140 may extend along the upper surface of the first interlayer insulating film 110. The first etching stop film 140 may include, e.g., at least one of silicon nitride (SiN), silicon oxynitride (SiON), silicon carbonitride (SiCN), and combinations thereof.

The second interlayer insulating film 210 may be formed on the first etching stop film 140. That is, the first etching stop film 140 may be interposed between the first interlayer insulating film 110 and the second interlayer insulating film 210. The second interlayer insulating film 210 may include, e.g., the same material as the first interlayer insulating film 110.

The first via 220 may be formed in the second interlayer insulating film 210. For example, the second interlayer insulating film 210 may include a first via hole V1 which penetrates the second interlayer insulating film 210 and the first etching stop film 140 to expose a part of the upper surface of the first wiring pattern 120. The first via hole V1 may extend in a direction intersecting the upper surface of the substrate 100, e.g., along the seventh direction DR7. The first via 220 may fill the first via hole V1 of the second interlayer insulating film 210. Thus, the first via 220 may penetrate the second interlayer insulating film 210 and the first etching stop film 140, and may be connected to the upper surface of the first wiring pattern 120. The first via 220 may include, e.g., the same material as the first wiring pattern 120.

The second etching stop film 240 may be formed on the second interlayer insulating film 210. For example, the second etching stop film 240 may extend along the upper surface of the second interlayer insulating film 210. The second etching stop film 240 may include, e.g., the same material as the first etching stop film 140.

The third interlayer insulating film 310 may be formed on the second etching stop film 240. That is, the second etching stop film 240 may be interposed between the second interlayer insulating film 210 and the third interlayer insulating film 310. The third interlayer insulating film 310 may include, e.g., the same material as the first interlayer insulating film 110.

The second wiring pattern 320 may be formed in the third interlayer insulating film 310. For example, the third interlayer insulating film 310 may include a second trench T2. The second wiring pattern 320 may fill the second trench T2.

The second trench T2 is illustrated as extending in the same first direction DR1 as the first trench T1, but this is only for convenience of explanation. For example, the second trench T2 may extend in another direction intersecting the direction in which the first trench T1 extends. As a result, the second wiring pattern 320 may extend long in the third interlayer insulating film 310. The second wiring pattern 320 may include, e.g., the same material as the first wiring pattern 120.

In some embodiments, at least a part of the second trench T2 may penetrate the second etching stop film 240 to communicate, e.g., be in fluid communication, with the first via hole V1. As a result, the second wiring pattern 320 may be, e.g., directly, connected to the first via 220, e.g., the second wiring pattern 320 and the first via 220 may define a single integral structure. That is, the first via 220 may connect the first wiring pattern 120 and the second wiring pattern 320.

In some embodiments, the first via 220 and the second wiring pattern 320 may be formed at the same level. In the present specification, the expression "the same level" means formation by the same fabricating process, e.g., to form a single and seamless structure. For example, the first via 220 and the second wiring pattern 320 may be formed by a dual damascene process.

In some embodiments, a second barrier conductive film 230 may be interposed between the first via 220 and the second interlayer insulating film 210, and between the second wiring pattern 320 and the third interlayer insulating film 310. For example, the second barrier conductive film 230 may extend, e.g., conformally, along the sidewalls and the bottom surface of the first via hole V1 and the sidewalls of the second trench T2.

The second barrier conductive film 230 may prevent an element (e.g., copper (Cu)) contained in the first via 220 and the second wiring pattern 320 from being diffused to the second interlayer insulating film 210, the third interlayer insulating film 310 and the like. The second barrier conductive film 230 may include, e.g., the same material as the first barrier conductive film 130.

The third wiring pattern 325 may be formed in the third interlayer insulating film 310 to be spaced apart from the second wiring pattern 320, e.g., along a second direction DR2. For example, the third interlayer insulating film 310 may include a third trench T3 spaced apart from the second trench T2. The third wiring pattern 325 may fill the third trench T3.

The second trench T2 and the third trench T3 may be arranged along a second direction DR2 parallel to the upper surface of the substrate 100 and intersecting the first direction DR1. The second trench T2 is illustrated as extending in the same first direction DR1 as the first trench T1, but this is only for convenience of explanation. As a result, the third wiring pattern 325 may extend long in the third interlayer insulating film 310 to be spaced apart from the second wiring pattern 320, e.g., along the second direction DR2.

The third wiring pattern 325 may include, e.g., the same material as the first wiring pattern 120. In some embodiments, the second wiring pattern 320 and the third wiring pattern 325 may be formed at the same level.

In some embodiments, the bottom surface of the third trench T3 may be defined by the second etching stop film 240, e.g., the third trench T3 may extend only partially into the second etching stop film 240. Accordingly, the lower part of the third wiring pattern 325 may be buried in the second etching stop film 240.

In some embodiments, a third barrier conductive film 235 may be interposed between the third interlayer insulating film 310 and the third wiring pattern 325. For example, the third barrier conductive film 235 may extend, e.g., confromally, along the sidewalls and the bottom surface of the third trench T3.

The third barrier conductive film 235 prevents an element (e.g., copper (Cu)) contained in the third wiring pattern 325 from being diffused into the third interlayer insulating film 310 or the like. The third barrier conductive film 235 may include, e.g., the same material as the first barrier conductive film 130. In some embodiments, the second barrier conductive film 230 and the third barrier conductive film 235 may be formed at the same level.

The first capping film 150 may be formed on the third interlayer insulating film 310. The first capping film 150 may cover the upper surface of the third interlayer insulating film 310, the upper surface of the second wiring pattern 320, and the upper surface of the third wiring pattern 325. The first capping film 150 may include, e.g., at least one of silicon nitride (SiN), silicon oxynitride (SiON), silicon carbonitride (SiCN), and combinations thereof.

The third interlayer insulating film 310 may include a plurality of air gaps 312. Each of the air gaps 312 may be a cavity or a void formed in the third interlayer insulating film 310. For example, as illustrated in FIG. 2, each of the air gaps 312 may have a decreasing width in the second direction DR2, as a distance from the etch stop layer 240 along the seventh direction DR7 decreases.

The plurality of air gaps 312 may be arranged periodically, e.g., spaced apart from each other along the second direction DR2 at repeated and regular intervals. For example, the plurality of air gaps 312 may include first to third air gaps G1, G2 and G3 that are adjacent to each other and sequentially arranged. Although the first to third air gaps G1, G2 and G3 are illustrated as being sequentially arranged in the second direction DR2, this is for convenience of explanation, and embodiments are not limited thereto. For example, as illustrated in FIG. 1A, the plurality of air gaps 312 may be arranged in a honeycomb pattern in two direction, as viewed in a top view.

As illustrated in FIGS. 1B and 2, a spaced distance D1 between the first air gap G1 and the second air gap G2, e.g., measured along the second direction DR2, may be the same as a spaced distance D2 between the second air gap G2 and the third air gap G3, e.g., measured along the second direction DR2. In the present specification, the term "the same" means not only completely the same thing but also a fine difference which may occur due to a process margin or the like. For example, as illustrated in FIG. 2, a width, e.g., diameter, of each air gap 312 in the second direction DR2 may be smaller than a width of each of the first and second spaced distances D1 and D2 in the second direction.

In some embodiments, the plurality of air gaps 312 may be formed in the third interlayer insulating film 310 between the second wiring pattern 320 and the third wiring pattern 325. For example, as illustrated in FIGS. 1A and 2, the first to third air gaps G1, G2 and G3 may be interposed between the second wiring pattern 320 and the third wiring pattern 325. For example, as illustrated in FIG. 2, a width, e.g., diameter, of each air gap 312 in the second direction DR2 may be smaller than a width of each of the second and third wiring patterns 320 and 325 in the second direction DR2.

In some embodiments, the plurality of air gaps 312 may be arranged in a honeycomb structure from a planar viewpoint, as illustrated in FIGS. 1A and 1B. For example, as illustrated in FIG. 1B, the plurality of air gaps 312 may include a fourth air gap G4 adjacent to the first air gap G1 and the third air gap G3.

As illustrated in FIG. 1B, the first air gap G1, the third air gap G3, and the fourth air gap G4 may be arranged in an equilateral triangular structure from the planar viewpoint. For example, a third direction DR3, in which the first air gap G1 and the fourth air gap G4 are arranged, may form an angle of 60° with the direction in which the first air gap G1 and the second air gap G2 are arranged (e.g., the second direction DR2). Further, e.g., the spaced distance D1 between the first air gap G1 and the second air gap G2, the spaced distance D3 between the first air gap G1 and the fourth air gap G4, and the spaced distance D4 between the second air gap G2 and the fourth air gap G4 may be the same as each other.

In some embodiments, each air gap 312 may be in the form of a cylinder. For example, as illustrated in FIGS. 1A and 2, each air gap 312 may be in the form of a cylinder in which a vertical axis extends from the second etching stop film 240 to the first capping film 150.

In some embodiments, the plurality of air gaps 312 may be formed by a directed self-assembly (DSA) lithography process. For example, the plurality of air gaps 312 arranged in a honeycomb structure may be formed by a block copolymer (BCP) forming a cylindrical copolymer. This will be described later in detail with reference to FIGS. 18 to 24.

In some embodiments, the third direction DR3, in which the first air gap G1 and the fourth air gap G4 are arranged, may form an acute angle θ1 with the first direction DR1 in which the first wiring pattern 120 extends.

Each air gap 312 may extend from the second etching stop film 240 to the first capping film 150. For example, as illustrated in FIG. 3A, the lower part of each air gap 312 may be defined, e.g., enclosed, by a part of the upper surface of the second etching stop film 240. Also, e.g., as illustrated in FIG. 4A, the upper part of each air gap 312 may be defined, e.g., enclosed, by a part of the bottom surface of the first capping film 150.

In some embodiments, as illustrated in FIG. 3B, the bottom surface of each air gap 312 may be lower by D5 than the uppermost surface of the second etching stop film 240. For example, the lower part of each air gap 312 may be formed by etching a part of the upper part of the second etching stop film 240.

In some embodiments, as illustrated in FIG. 4B, the bottom surface of the first capping film 150 defining each air gap 312 may include a first convex surface 150S1 and a second convex surface 150S2. The first convex surface 150S1 and the second convex surface 150S2 may be convex downward. Also, the first capping film 150 may include a cusp 150P at a point on which the first convex surface 150S1 and the second convex surface 150S2 meet. This may be attributed to usage of materials having poor step coverage in some processes forming the air gap 312.

As the down-scaling of the semiconductor device rapidly progresses, in order to reduce the coupling phenomenon between the wirings, an air gap may be formed in the interlayer insulating film in which the wiring is formed. However, since the interlayer insulating film with the air gap formed thereon may not be firmly supported, it may cause decreases in the yield and reliability of the semiconductor device.

In contrast, the semiconductor device according to some embodiments firmly supports the interlayer insulating film (e.g., the third interlayer insulating film 310) on which the wirings (e.g., the second wiring pattern 320 and the third wiring pattern 325) are formed, using a plurality of periodically arranged air gaps 312, and may reduce the coupling phenomenon between the wirings. For example, the small width of the air gaps 312 allows to maintain sufficient stability of the interlayer insulating film, while reducing coupling between the wirings.

Further, in the semiconductor device according to some embodiments, the plurality of air gaps 312 does not extend to the interlayer insulating film (e.g., the second interlayer insulating film 210) in which a via (e.g., the first via 220) is formed. As a result, the interlayer insulating film (e.g., the second interlayer insulating film 210 and the third interlayer insulating film 310) is more firmly supported, and the coupling phenomenon between the wirings (e.g., the second wiring pattern 320 and the third wiring pattern 325) may be alleviated. Therefore, a semiconductor device with improved product reliability and performance may be provided.

Figure 5:
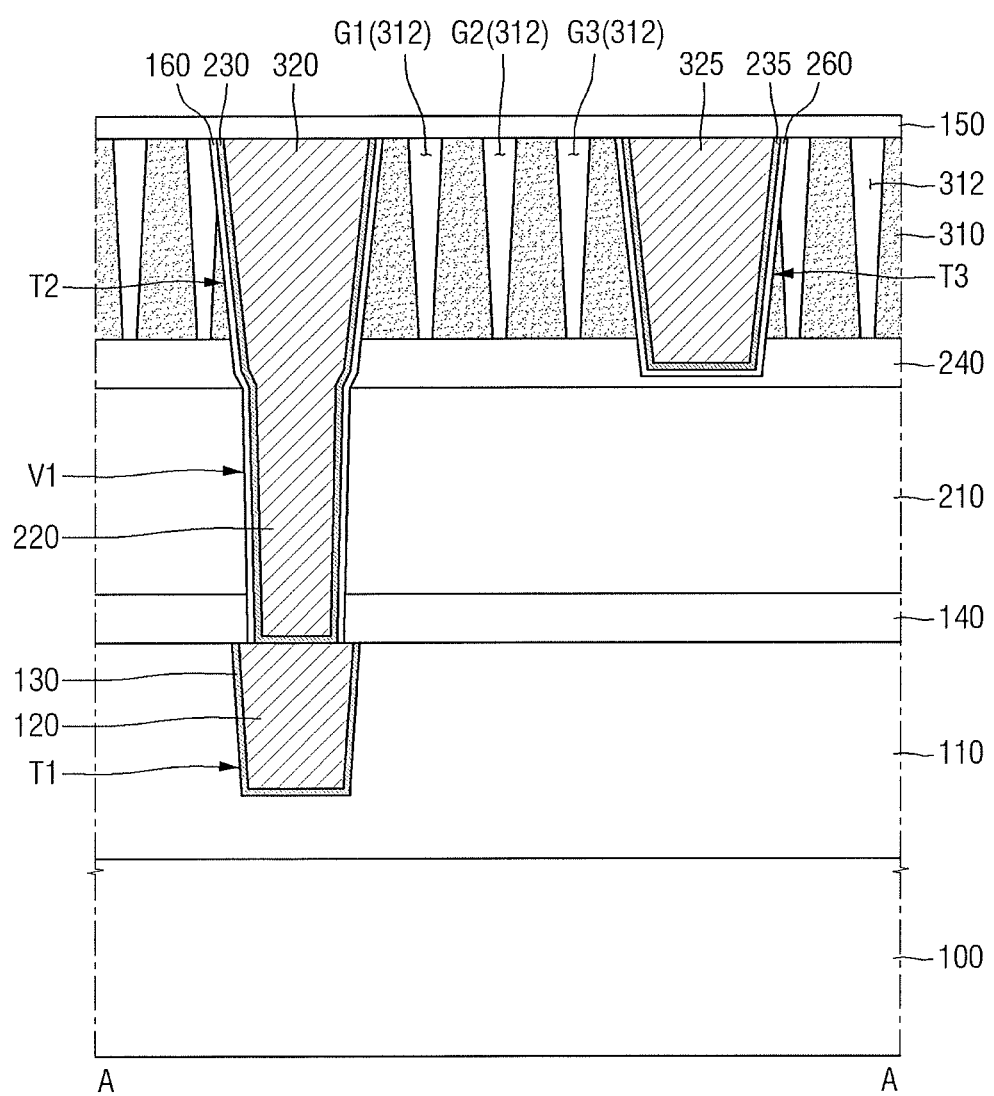
FIG. 5 illustrates a cross-sectional view of a semiconductor device according to some embodiments.

FIG. 5 is a cross-sectional view illustrating a semiconductor device according to some embodiments. For the sake of convenience of explanation, repeated parts of those described with reference to FIGS. 1A to 4B will be only briefly explained or omitted.

Referring to FIG. 5, the semiconductor device according to some embodiments may further include a first protective film 160 and a second protective film 260.

The first protective film 160 may extend along the sidewalls of the first via hole V1 and the sidewalls of the second trench T2. The first protective film 160 may prevent damage to the second wiring pattern 320 and/or the second barrier conductive film 230 in the process of forming the plurality of air gaps 312. For example, the first protective film 160 protects the sidewalls of the second wiring pattern 320 and/or the sidewalls of the second barrier conductive film 230 from the etching process of forming the plurality of air gaps 312.

The second protective film 260 may extend along the sidewalls of the third trench T3. The second protective film 260 may prevent damage to the third wiring pattern 325 and/or the third barrier conductive film 235 in the process of forming the plurality of air gaps 312. For example, the second protective film 260 protects the sidewalls of the third wiring pattern 325 and/or the sidewalls of the third barrier conductive film 235 from the etching process of forming the plurality of air gaps 312.

The first protective film 160 and the second protective film 260 may include, e.g., at least one of silicon nitride (SiN), silicon oxynitride (SiON), silicon carbonitride (SiCN), and combinations thereof. In some embodiments, the first protective film 160 and the second protective film 260 may be formed at the same level.

Figure 6:
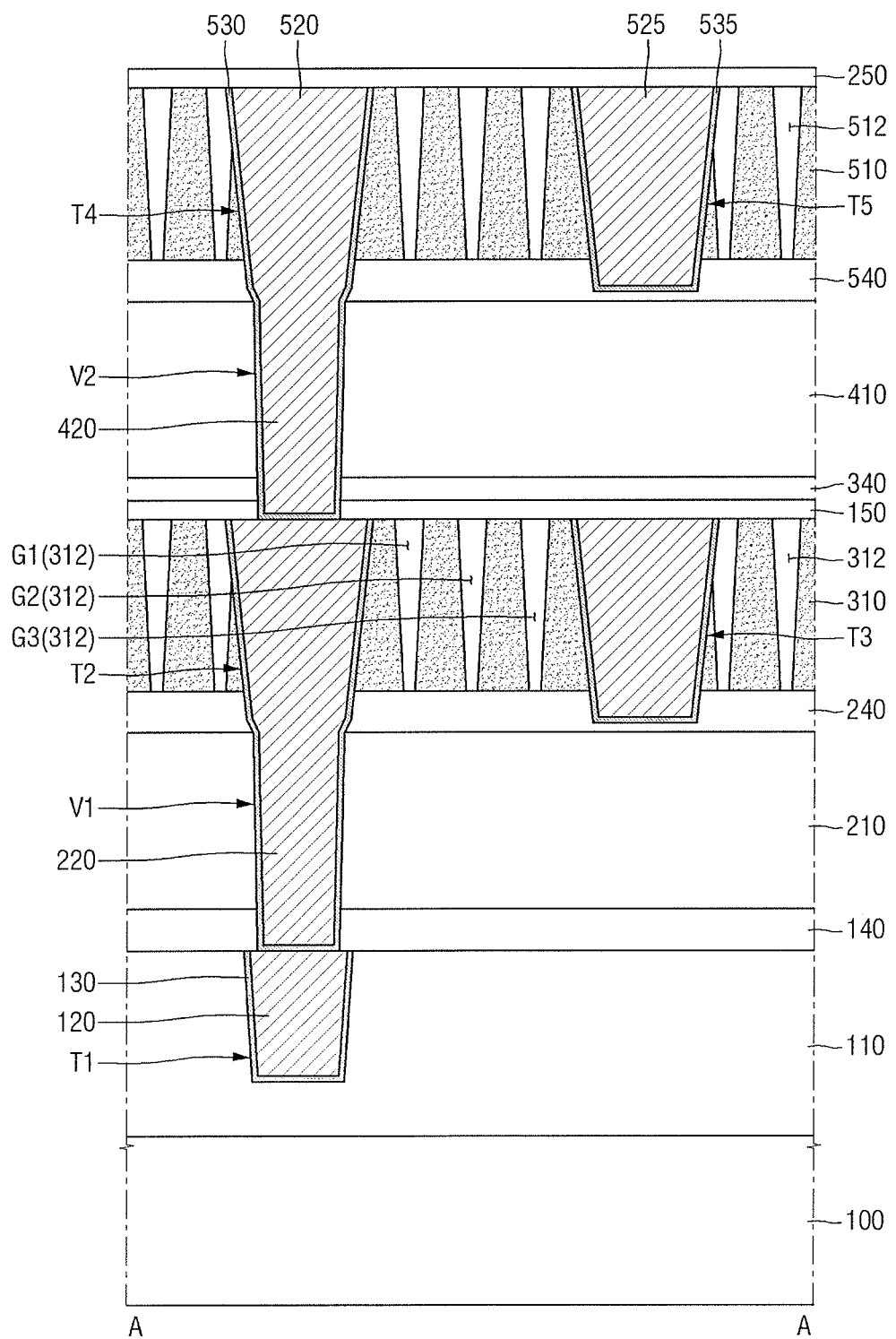
FIG. 6 illustrates a cross-sectional view of a semiconductor device according to some embodiments.

FIG. 6 is a cross-sectional view for explaining the semiconductor device according to some embodiments. For the sake of convenience of explanation, repeated parts of those described with reference to FIGS. 1A to 4B will be only briefly explained or omitted.

Referring to FIG. 6, the semiconductor device according to some embodiments may further include a third etching stop film 340, a fourth interlayer insulating film 410, a second via 420, a fourth etching stop film 540, a fifth interlayer insulating film 510, a fourth wiring pattern 520, a fifth wiring pattern 525, and a second capping film 250.

The third etching stop film 340 may be formed on the first capping film 150. The third etching stop film 340 may include, e.g., the same material as the first etching stop film 140. In some embodiments, the third etching stop film 340 may be omitted.

The fourth interlayer insulating film 410 may be formed on the third etching stop film 340. The fourth interlayer insulating film 410 may include, e.g., the same material as the first interlayer insulating film 110.

The second via 420 may be formed in the fourth interlayer insulating film 410. For example, the fourth interlayer insulating film 410 may include a second via hole V2 which penetrates the third etching stop film 340 and the first capping film 150 to expose a part of the upper surface of the second wiring pattern 320. The second via 420 may fill the second via hole V2 of the fourth interlayer insulating film 410. As a result, the second via 420 may penetrate the fourth interlayer insulating film 410, the third etching stop film 340, and the first capping film 150, and may be connected to the upper surface of the second wiring pattern 320. The second via 420 may include, e.g., the same material as the first wiring pattern 120.

The fourth etching stop film 540 may be formed on the fourth interlayer insulating film 410. For example, the fourth etching stop film 540 may extend along the upper surface of the fourth interlayer insulating film 410. The fourth etching stop film 540 may include, e.g., the same material as the first etching stop film 140.

The fifth interlayer insulating film 510 may be formed on the fourth etching stop film 540. The fifth interlayer insulating film 510 may include, e.g., the same material as the first interlayer insulating film 110.

The fourth wiring pattern 520 may be formed in the fifth interlayer insulating film 510. For example, the fifth interlayer insulating film 510 may include a fourth trench T4. The fourth wiring pattern 520 may fill the fourth trench T4.

In some embodiments, at least a part of the fourth trench T4 may penetrate the fourth etching stop film 540 to communicate with the second via hole V2. Thus, the fourth wiring pattern 520 may be connected to the second via 420.

In some embodiments, the second via 420 and the fourth wiring pattern 520 may be formed at the same level. For example, the second via 420 and the fourth wiring pattern 520 may be formed by a dual damascene process.

In some embodiments, a fourth barrier conductive film 530 may be interposed between the second via 420 and the fourth interlayer insulating film 410, and between the fourth wiring pattern 520 and the fifth interlayer insulating film 510. For example, the fourth barrier conductive film 530 may extend along the sidewalls and the bottom surface of the second via hole V2 and the sidewalls of the fourth trench T4.

The fifth wiring pattern 525 may be formed in the fifth interlayer insulating film 510 to be spaced apart from the fourth wiring pattern 520. For example, the fifth interlayer insulating film 510 may include a fifth trench T5 spaced apart from the fourth trench T4. The fifth wiring pattern 525 may fill the fifth trench T5.

In some embodiments, a fifth barrier conductive film 535 may be interposed between the fifth interlayer insulating film 510 and the fifth wiring pattern 525. For example, the fifth barrier conductive film 535 may extend along the sidewalls and the bottom surface of the fifth trench T5.

The second capping film 250 may be formed on the fifth interlayer insulating film 510. The second capping film 250 may cover the upper surface of the fifth interlayer insulating film 510, the upper surface of the fourth wiring pattern 520 and the upper surface of the fifth wiring pattern 525. The second capping film 250 may include, e.g., the same material as the first capping film 150.

The fifth interlayer insulating film 510 may include a plurality of air gaps 512. Each of the air gaps 512 may be a cavity or a void formed in the fifth interlayer insulating film 510. The plurality of air gaps 512 may be arranged periodically. Also, each air gap 512 may extend from the fourth etching stop film 540 to the second capping film 250. Since the air gap 512 of the fifth interlayer insulating film 510 may be similar to the air gap 312 of the third interlayer insulating film 310, the detailed explanation will be omitted below.

Figure 7:
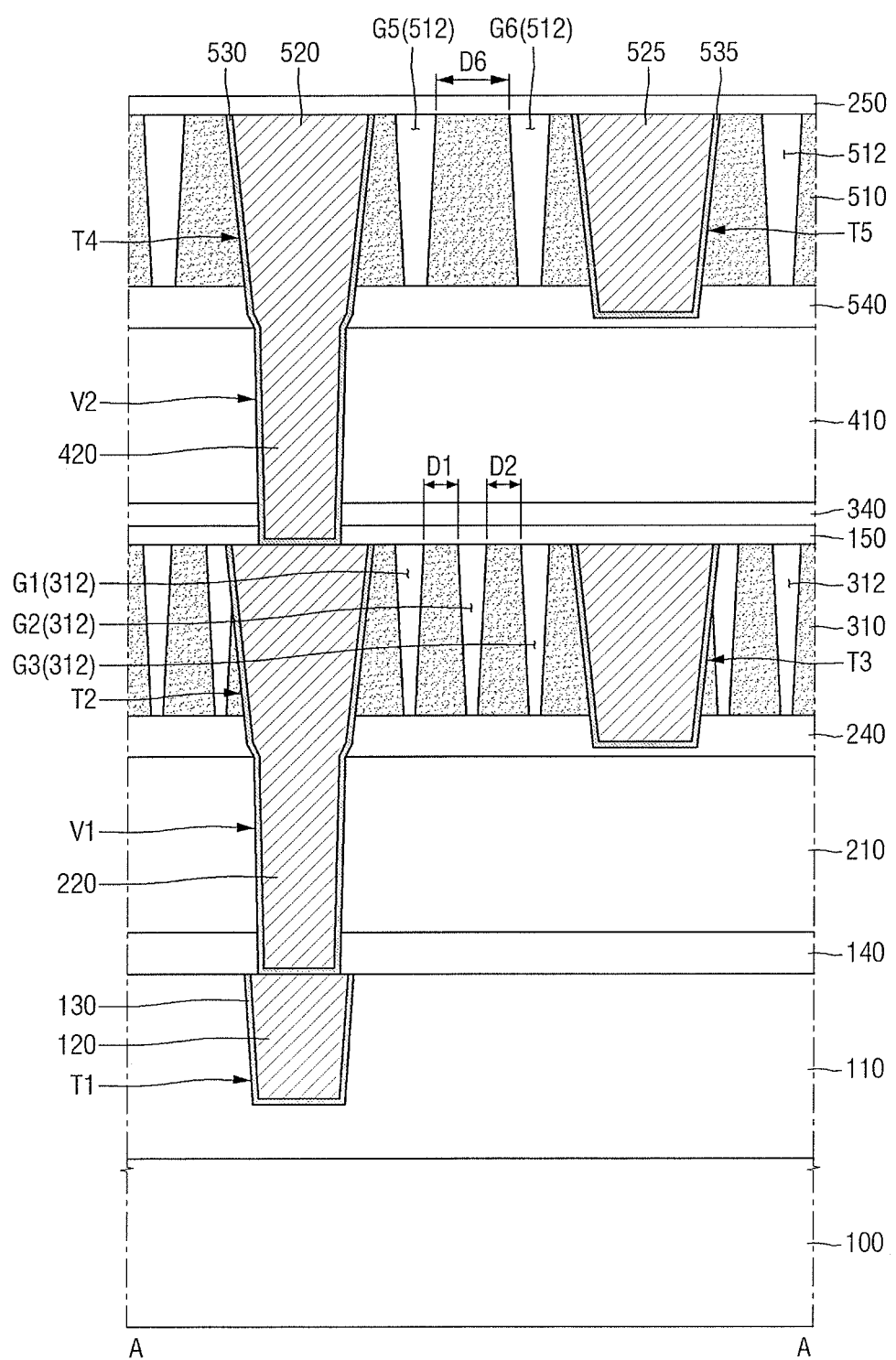
FIG. 7 illustrates a cross-sectional view of a semiconductor device according to some embodiments.

FIG. 7 is a cross-sectional view for explaining the semiconductor device according to some embodiments. For the sake of convenience of explanation, repeated parts of those described using FIGS. 1A to 4B and FIG. 6 will be only briefly explained or omitted.

Referring to FIG. 7, in the semiconductor device according to some embodiments, a distance at which the plurality of air gaps 312 of the third interlayer insulating film 310 are spaced apart from each other is different from a distance between the plurality of air gaps 512 of the fifth interlayer insulating film 510 are spaced apart from each other.

For example, the plurality of air gaps 512 of the fifth interlayer insulating film 510 may include fourth and fifth air gaps G4 and G5 adjacent to each other. At this time, a spaced distance D6 between the fourth air gap G4 and the fifth air gap G5 may be different from the spaced distance D1 between the first air gap G1 and the second air gap G2.

In FIG. 7, the spaced distance D6 between the fourth air gap G4 and the fifth air gap G5 is illustrated as being larger than the spaced distance D1 between the first air gap G1 and the second air gap G2, but this is only an example. For example, the spaced distance D6 between the fourth air gap G4 and the fifth air gap G5 may be smaller than the spaced distance D1 between the first air gap G1 and the second air gap G2.

Figure 8:
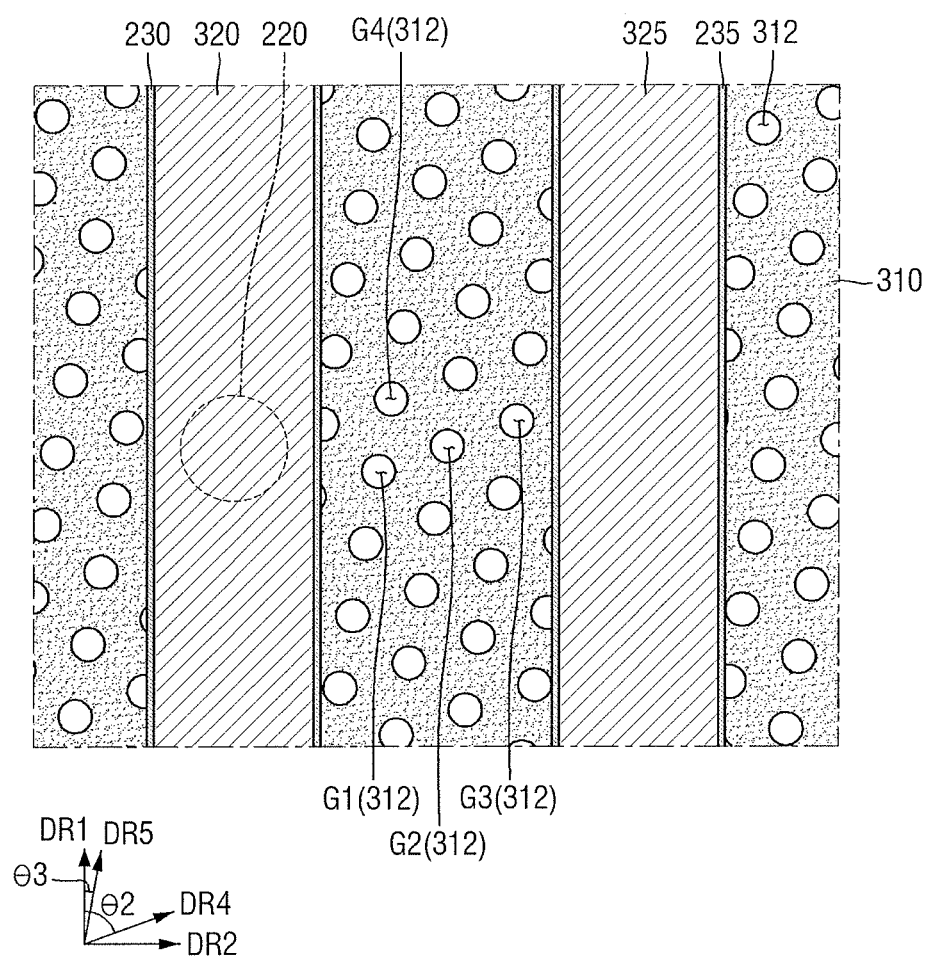
FIG. 8 illustrates a cross-sectional view of a semiconductor device according to some embodiments.

FIG. 8 is a layout diagram for explaining the semiconductor device according to some embodiments. For the sake of convenience of explanation, repeated parts of those described with reference to FIGS. 1A to 4B will be only briefly explained or omitted.

Referring to FIG. 8, in the semiconductor device according to some embodiments, the arrangement of the air gaps may be different, as viewed in a top view, as compared to the embodiments in FIGS. 1A-4B. That is, a part of the air gap 312 arranged in one row among the plurality of air gaps 312 intersects the direction in which the second wiring pattern 320 extends.

For example, the fourth direction DR4, in which the first air gap G1 and the second air gap G2 are arranged to be adjacent to each other, may form an acute angle $\theta 2$ with the first direction DR1, in which the second wiring pattern 320 extends. Further, e.g., the fifth direction DR5, in which the first air gap G1 and the fourth air gap G4 are arranged to be adjacent to each other, may form an acute angle $\theta 3$ with the first direction DR1 in which the second wiring pattern 320 extends.

Figure 9:
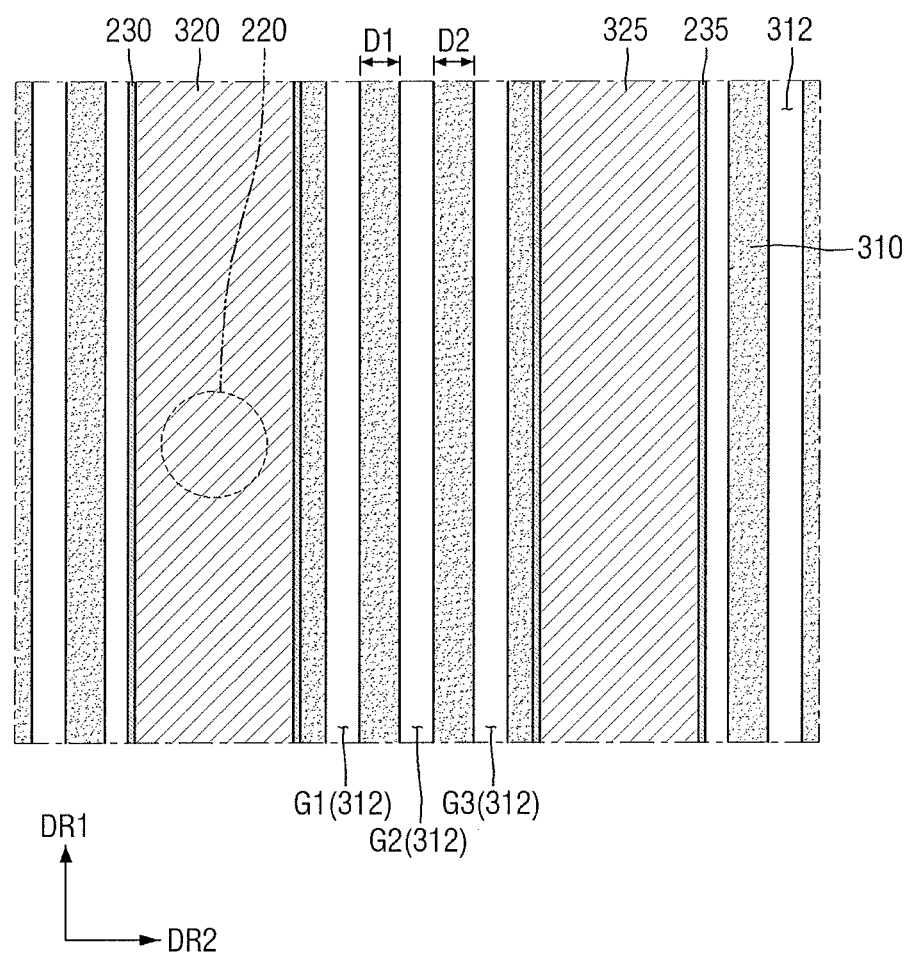
FIG. 9 illustrates a cross-sectional view of a semiconductor device according to some embodiments.

FIG. 9 is a layout diagram for explaining the semiconductor device according to some embodiments. For the sake of convenience of explanation, repeated parts of those described with reference to FIGS. 1A to 4B will be only briefly explained or omitted.

Referring to FIG. 9, in the semiconductor device according to some embodiments, each air gap 312 extends long in one direction. For example, the first to third air gaps G1, G2 and G3 may extend long in the first direction DR1, respectively.

For example, the first to third air gaps G1, G2 and G3 may be arranged periodically. For example, the spaced distance D1 between the first air gap G1 and the second air gap G2 may be the same as the spaced distance D2 between the second air gap G2 and the third air gap G3.

In some embodiments, the plurality of air gaps 312 may be formed by a directed self-assembly (DSA) lithography process. For example, the plurality of air gaps 312 extending long in one direction may be formed by a block copolymer (BCP) forming a lamellar copolymer.

Figure 10:
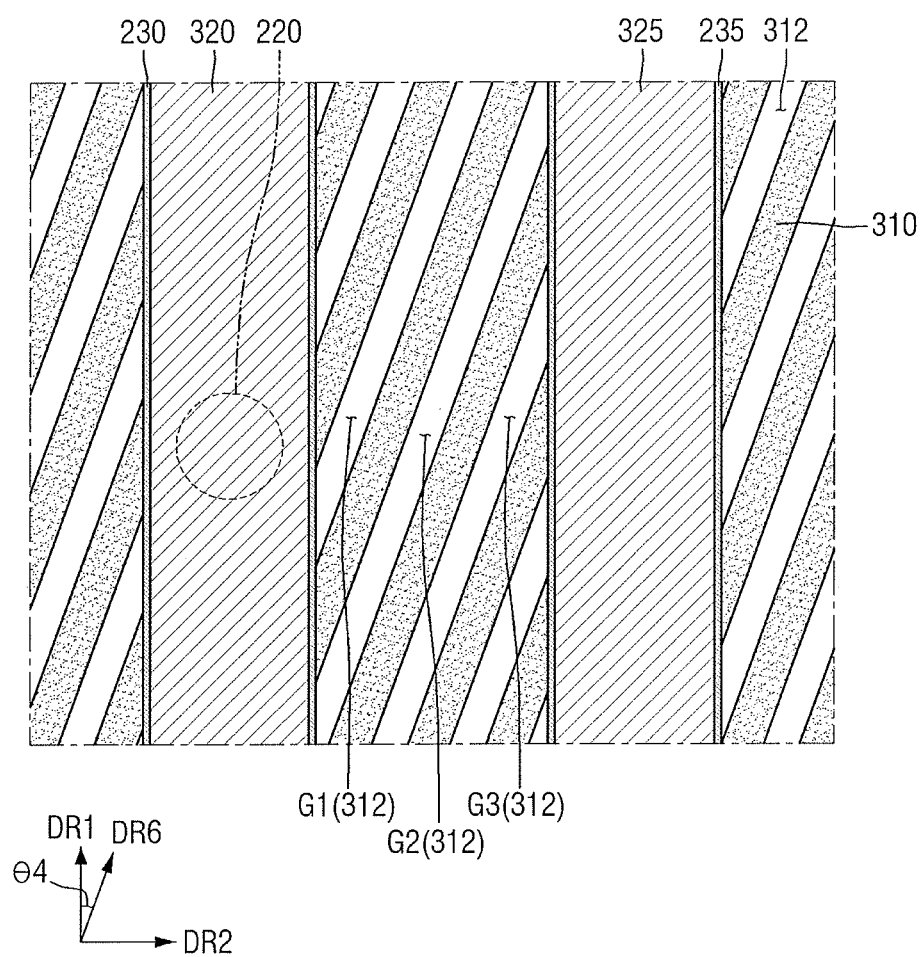
FIG. 10 illustrates a cross-sectional view of a semiconductor device according to some embodiments.

FIG. 10 is a layout diagram for explaining the semiconductor device according to some embodiments. For the sake of convenience of explanation, repeated parts of those described using FIGS. 1A to 4B and 9 will be only briefly explained or omitted.

Referring to FIG. 10, in the semiconductor device according to some embodiments, each air gap 312 extending long in one direction intersects the direction in which the second wiring pattern 320 extends.

For example, the sixth direction DR6 in which the first to third air gaps G1, G2 and G3 extend may form an acute angle θ4 with the first direction DR1 in which the second wiring pattern 320 extends. The sixth direction DR6 is only illustrated as forming an acute angle with the first direction DR1, but this is merely an example, and the sixth direction DR6 may of course form a right angle or obtuse angle with the first direction DR1. On the other hand, the first to third air gaps G1, G2 and G3 may be arranged periodically.

Hereinafter, a method for fabricating a semiconductor device according to some embodiments will be described with reference to FIGS. 11 to 24.

FIGS. 11 to 24 are stages in a method for fabricating a semiconductor device according to some embodiments. For the sake of convenience of explanation, repeated parts of those described with reference to FIGS. 1A to 4B will be only briefly explained or omitted.

Figure 11:
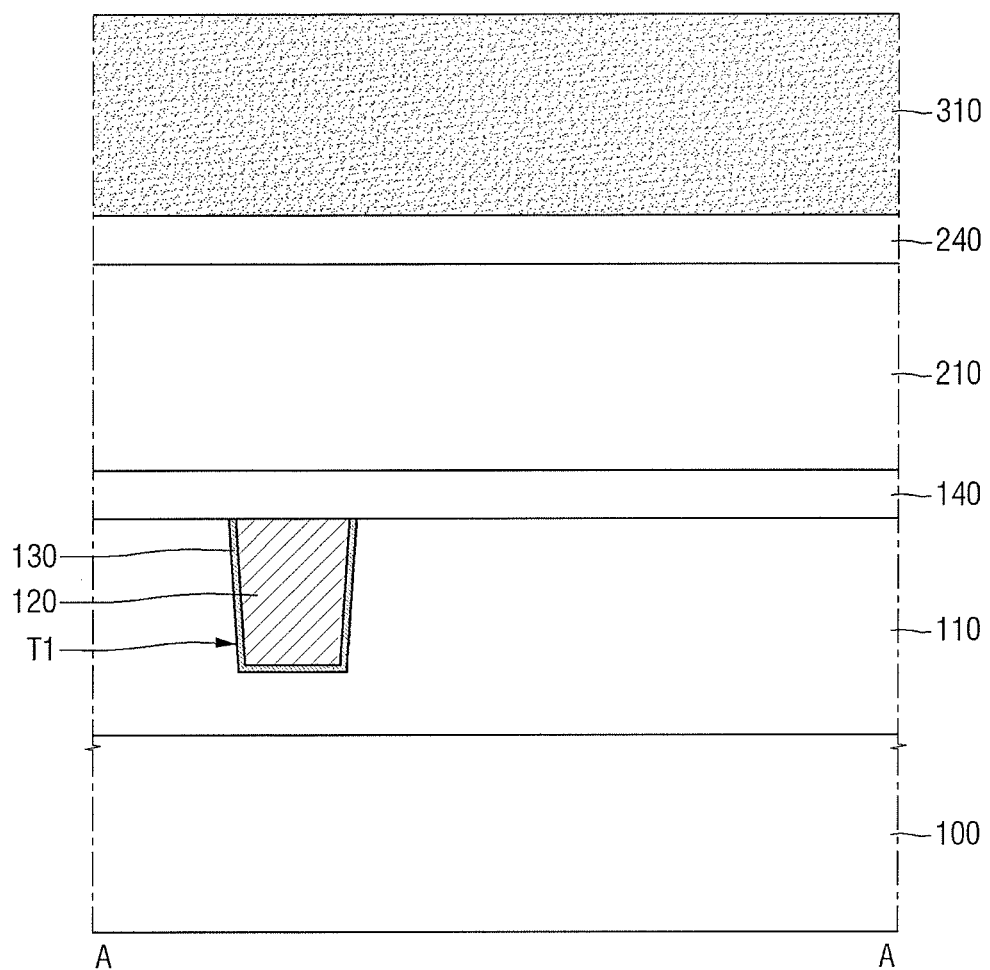
FIGS. 11 to 24 illustrate stages in a method for fabricating a semiconductor device according to some embodiments.

Referring to FIG. 11, the first interlayer insulating film 110, the first wiring pattern 120, the first etching stop film 140, the second interlayer insulating film 210, the second etching stop film 240, and the third interlayer insulating film 310 are sequentially formed on the substrate 100.

The first interlayer insulating film 110 may be formed on the substrate 100. The first wiring pattern 120 may be formed in the first interlayer insulating film 110. The first wiring pattern 120 may fill the first trench T1 of the first interlayer insulating film 110. In some embodiments, the first barrier conductive film 130 may be interposed between the first interlayer insulating film 110 and the first wiring pattern 120.

The first etching stop film 140 may be formed on the first interlayer insulating film 110 and the first wiring pattern 120. The second interlayer insulating film 210 may be formed on the first etching stop film 140. The second etching stop film 240 may be formed on the second interlayer insulating film 210. The third interlayer insulating film 310 may be formed on the second etching stop film 240.

The first to third interlayer insulating films 110, 210 and 310 may include, e.g., at least one of silicon oxide, silicon nitride, silicon oxynitride, a low dielectric constant material having a lower dielectric constant than silicon oxide, and combinations thereof. The first and second etching stop films 140 and 240 may include, e.g., at least one of silicon nitride (SiN), silicon oxynitride (SiON), silicon carbonitride (SiCN), and combinations thereof. The first etching stop film 140 and the second etching stop film 240 may be formed, e.g., by a chemical vapor deposition (CVD) process or an atomic layer deposition (ALD) process.

Figure 12:
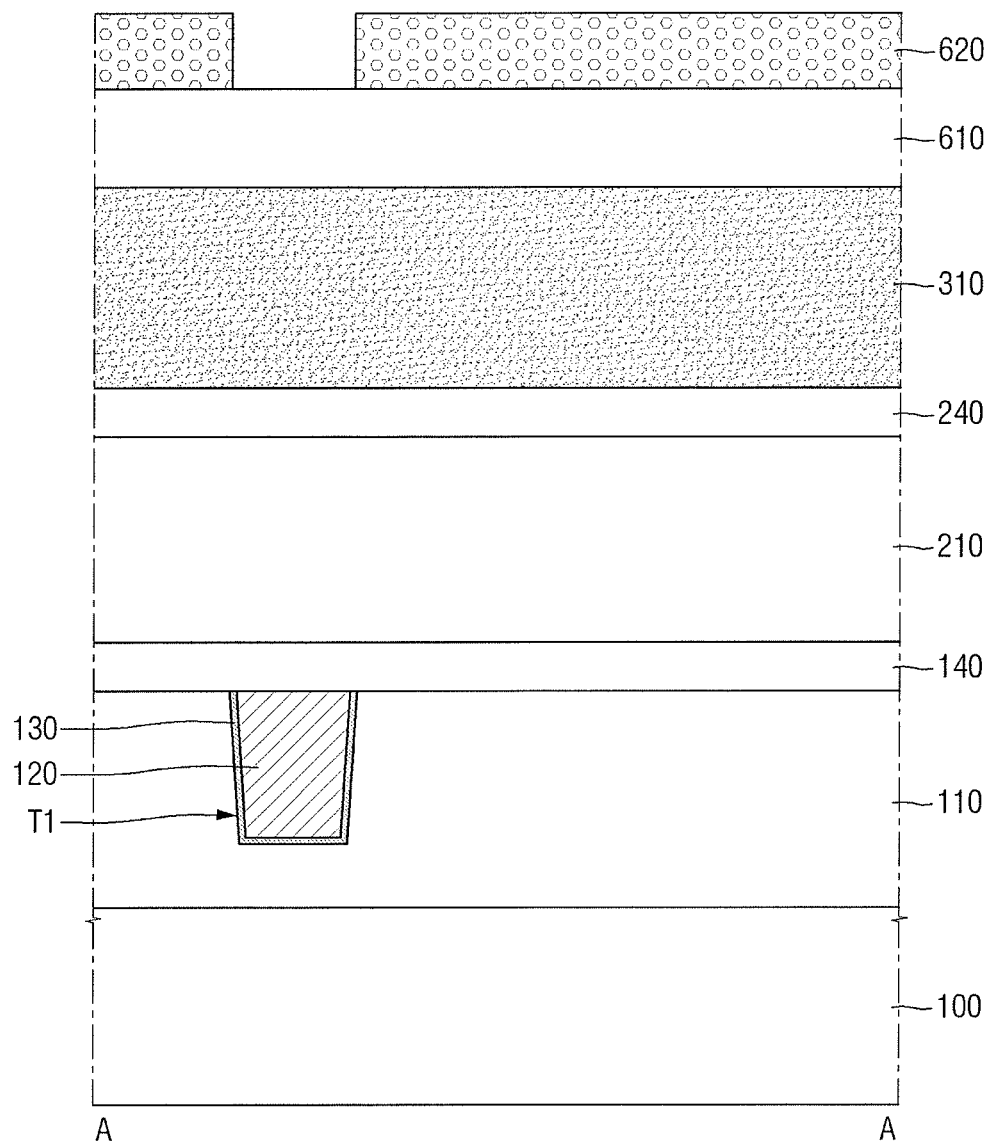

Referring to FIG. 12, a first hard mask 610 and a first photoresist 620 are sequentially formed on the third interlayer insulating film 310.

The first hard mask 610 may cover the upper surface of the third interlayer insulating film 310. The first hard mask 610 may include, e.g., SOH (spin-on hard mask).

The first photoresist 620 may expose a part of the first hard mask 610. In some embodiments, the first photoresist 620 may expose a part of a region which overlaps the first wiring pattern 120.

Figure 13:
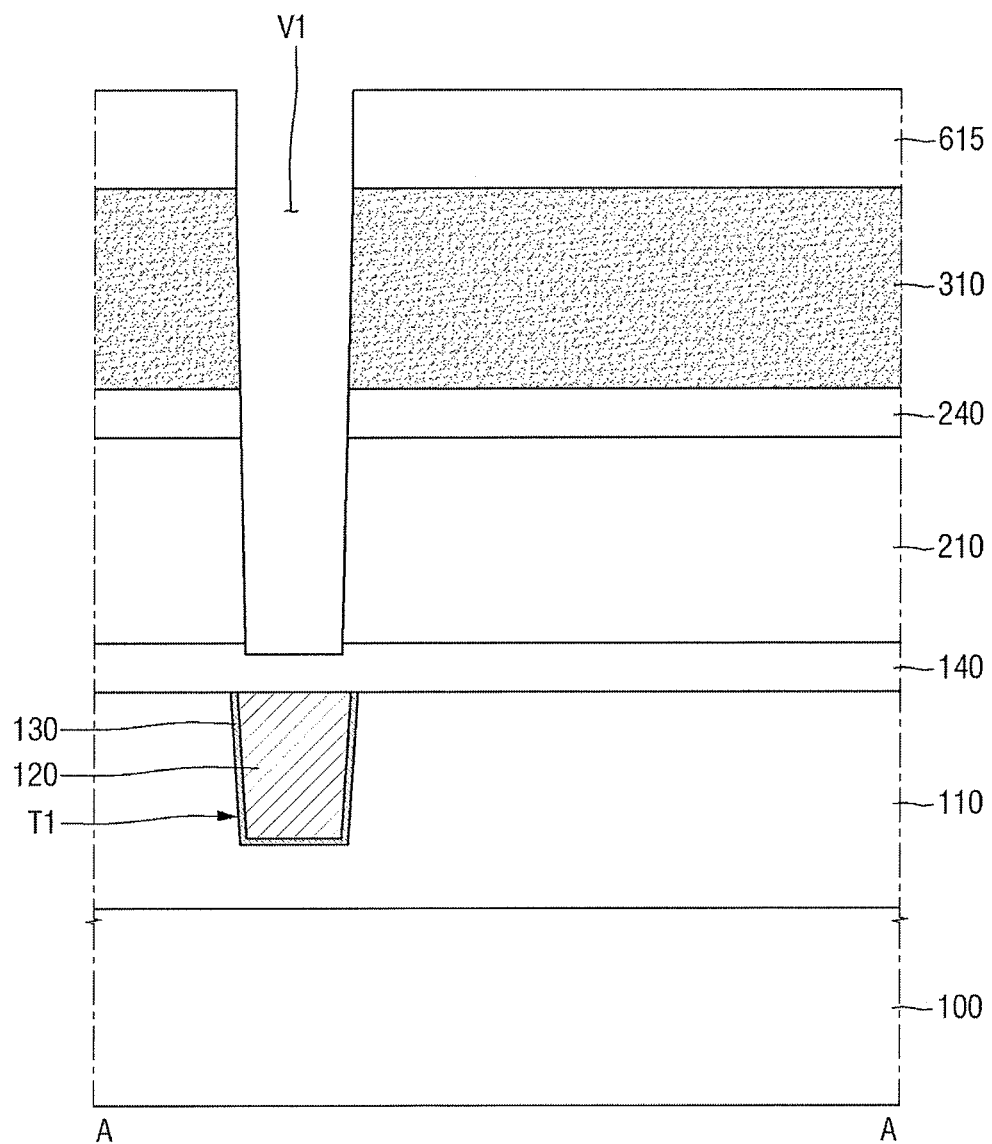

Referring to FIG. 13, the first via hole V1 is formed, using the first hard mask 610. The first hard mask 610 may be patterned by the first photoresist 620 of FIG. 12. As a result, the first hard mask 610 which exposes a part of the region overlapping the first wiring pattern 120 may be formed.

Subsequently, the first via hole V1 which sequentially penetrates the third interlayer insulating film 310, the second etching stop film 240, and the second interlayer insulating film 210 may be formed, by an etching process which uses the first hard mask 610 as an etching mask. In some embodiments, the first via hole V1 may not completely penetrate the first etching stop film 140. The first etching stop film 140 may be used, e.g., to prevent damage to the first wiring pattern 120 in a later process.

Figure 14:
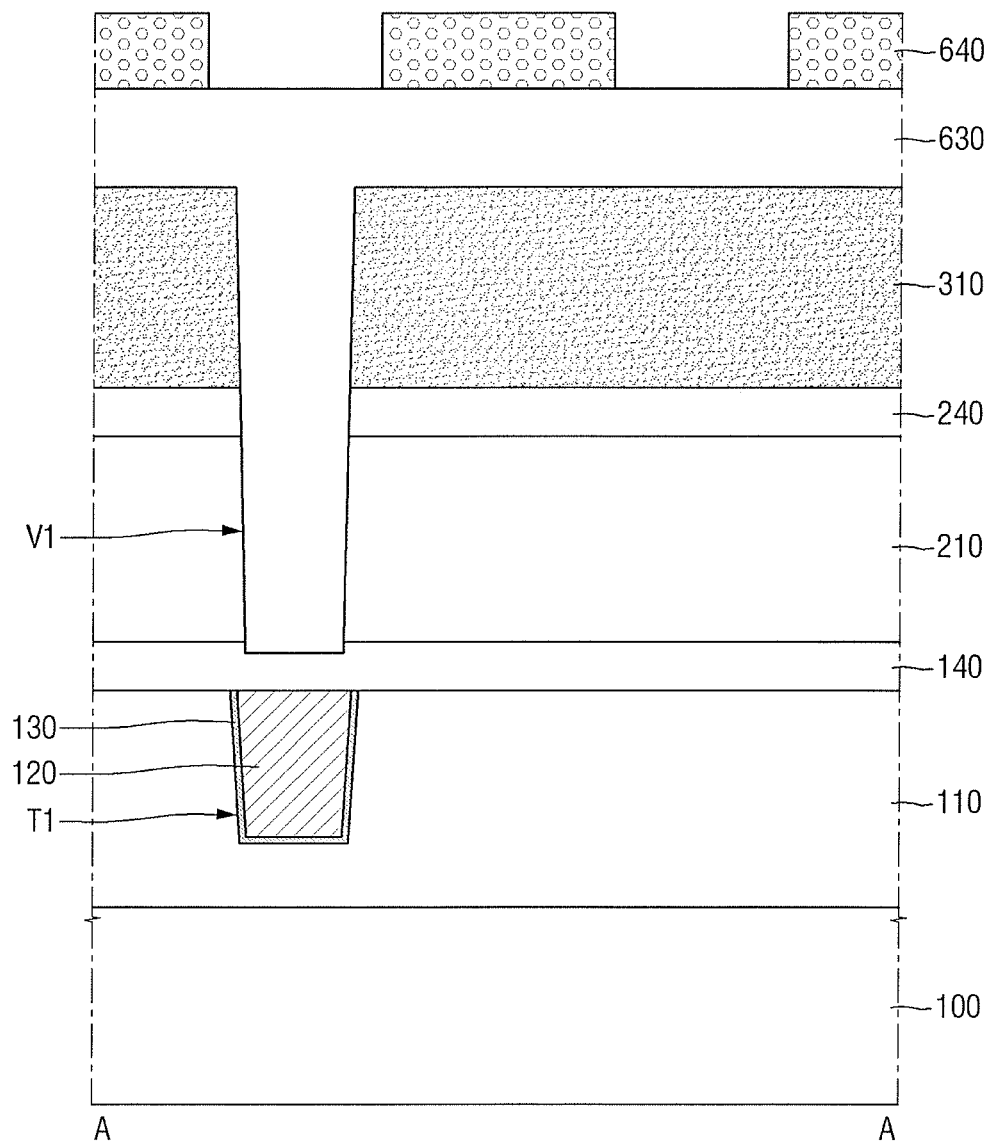

Referring to FIG. 14, a second hard mask 630 and a second photoresist 640 are sequentially formed.

The second hard mask 630 may cover the upper surface of the third interlayer insulating film 310. In addition, the second hard mask 630 may fill the first via hole V1. The second hard mask 630 may include, e.g., a SOH (spin-on hard mask).

The second photoresist 640 may expose a part of the second hard mask 630. In some embodiments, the second photoresist 640 may expose a region which overlaps the first via hole V1.

Figure 15:
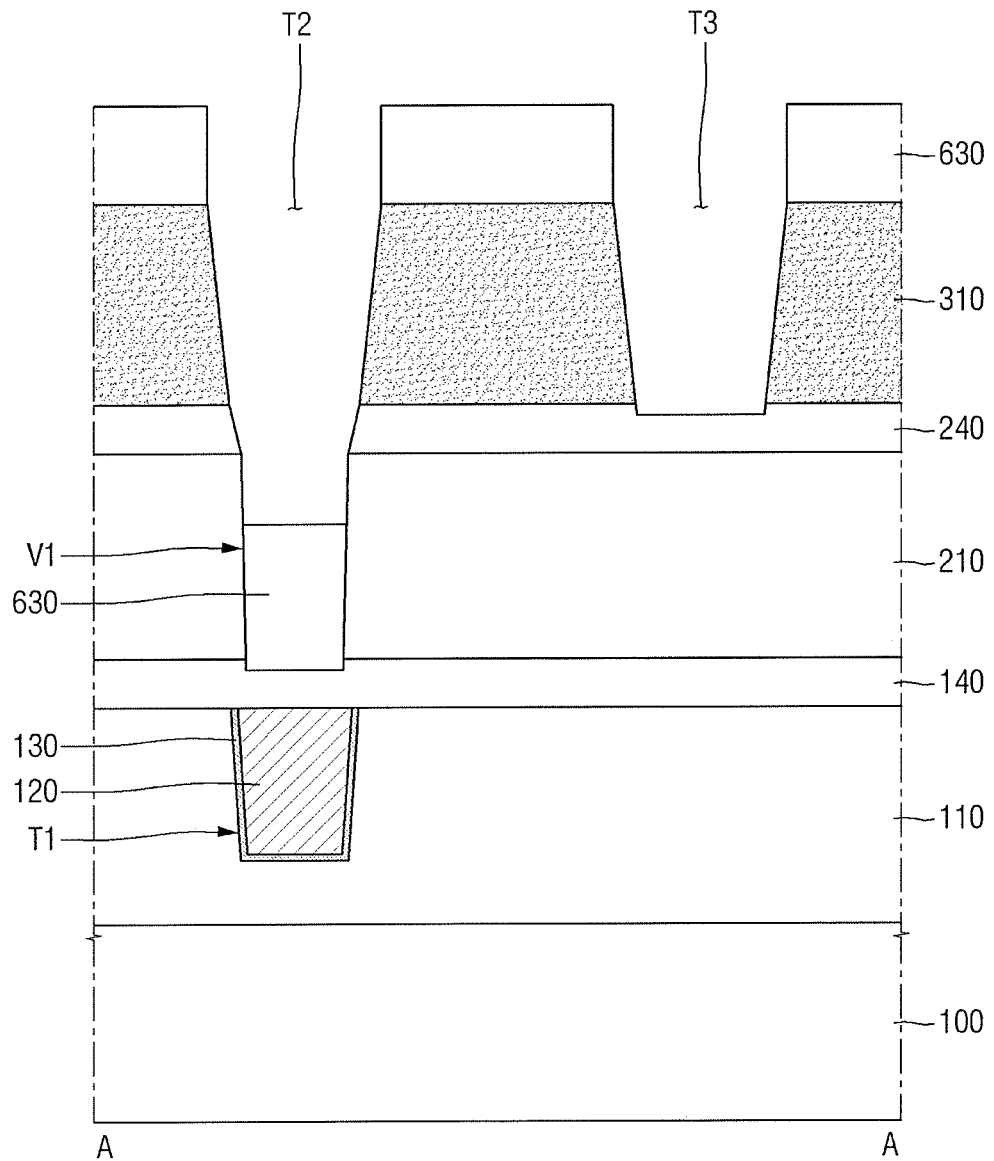

Referring to FIG. 15, a second trench T2 and a third trench T3 are formed, using the second hard mask 630.

The second hard mask 630 may be patterned by the second photoresist 640 of FIG. 14. As a result, the second hard mask 630 which exposes the region overlapping the first via hole V1 may be formed. In some embodiments, a part of the patterned second hard mask 630 may remain in the first via hole V1.

Subsequently, the second trench T2 and the third trench T3 in the third interlayer insulating film 310 may be formed by an etching process which uses the second hard mask 630 as an etching mask. In some embodiments, the second trench T2 and the third trench T3 may not completely penetrate the second etching stop film 240. Since the second trench T2 overlaps the first via hole V1, the second trench T2 may communicate with the first via hole V1.

Figure 16:
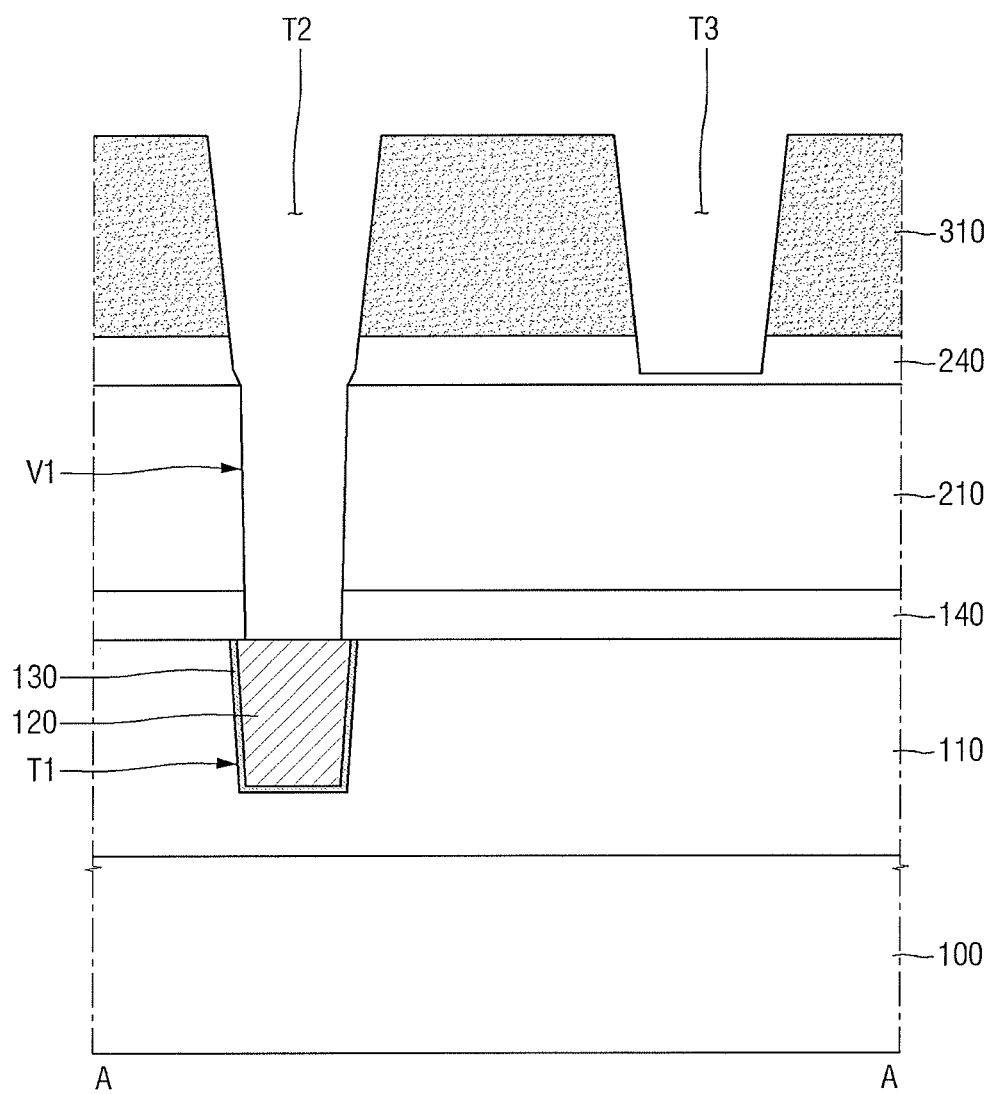

Referring to FIG. 16, a part of the upper surface of the first wiring pattern 120 is exposed, using the first via hole V1.

For example, a part of the first etching stop film 140 exposed by the first via hole V1 may be removed. Thus, the first via hole V1 which exposes a part of the upper surface of the first wiring pattern 120 may be formed.

In some embodiments, the third trench T3 may not completely penetrate the second etching stop film 240. The second etching stop film 240 may be used to prevent damage to the second interlayer insulating film 210, e.g., in the process of forming the first via hole V1.

Figure 17:
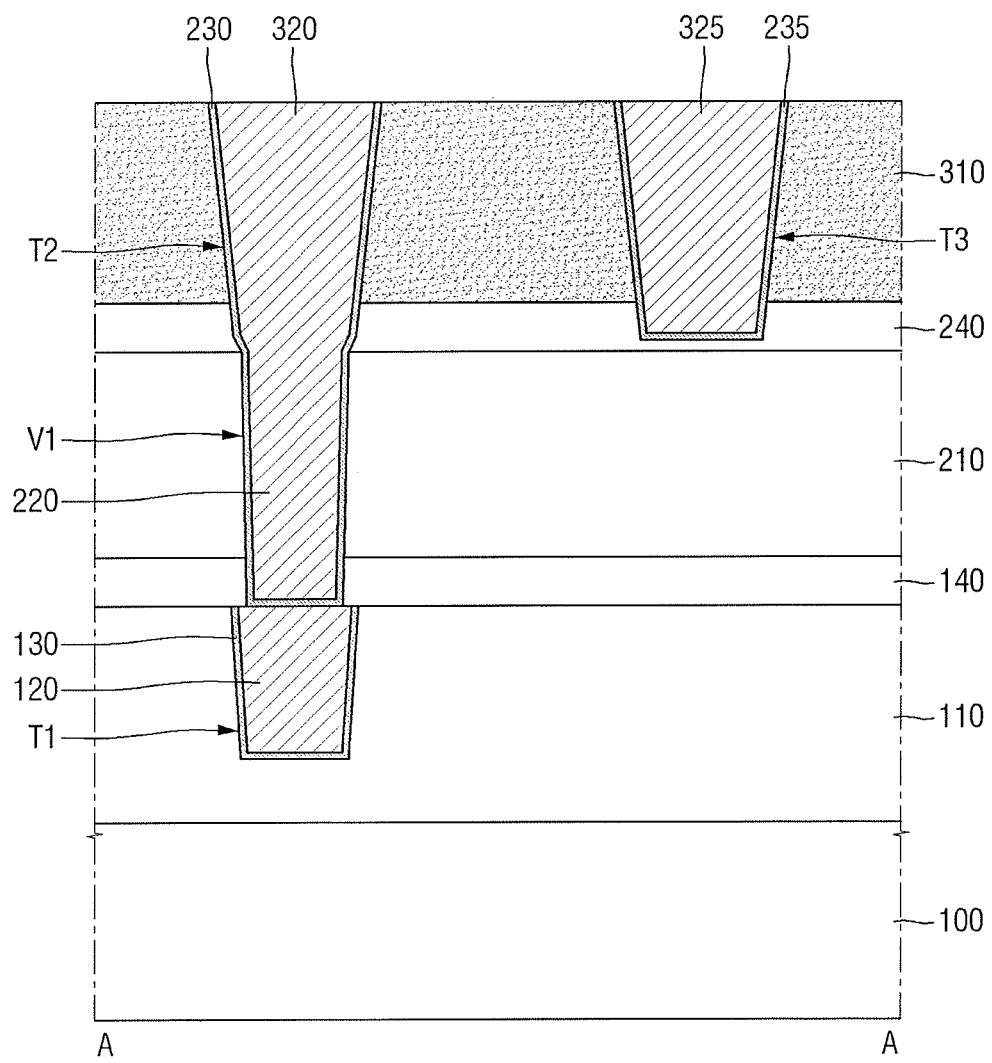

Referring to FIG. 17, the first via 220 is formed in the second interlayer insulating film 210, and the second wiring pattern 320 and the third wiring pattern 325 are formed in the third interlayer insulating film 310.

For example, a conductive film which fills the first via hole V1, the second trench T2, and the third trench T3 may be formed on the third interlayer insulating film 310. Subsequently, a planarization process of exposing the third interlayer insulating film 310 may be performed. As a result, the first via 220 for filling the first via hole V1, the second wiring pattern 320 for filling the second trench T2, and the third wiring pattern 325 for filling the third trench T3 may be formed.

In some embodiments, the second barrier conductive film 230 and the third barrier conductive film 235 may be further formed, before forming the first via 220, the second wiring pattern 320, and the third wiring pattern 325. The second barrier conductive film 230 may extend along sidewalls and bottom surface of the first via hole V1 and sidewalls of the second trench T2. The third barrier conductive film 235 may extend along the sidewalls and the bottom surface of the third trench T3.

Figure 18:
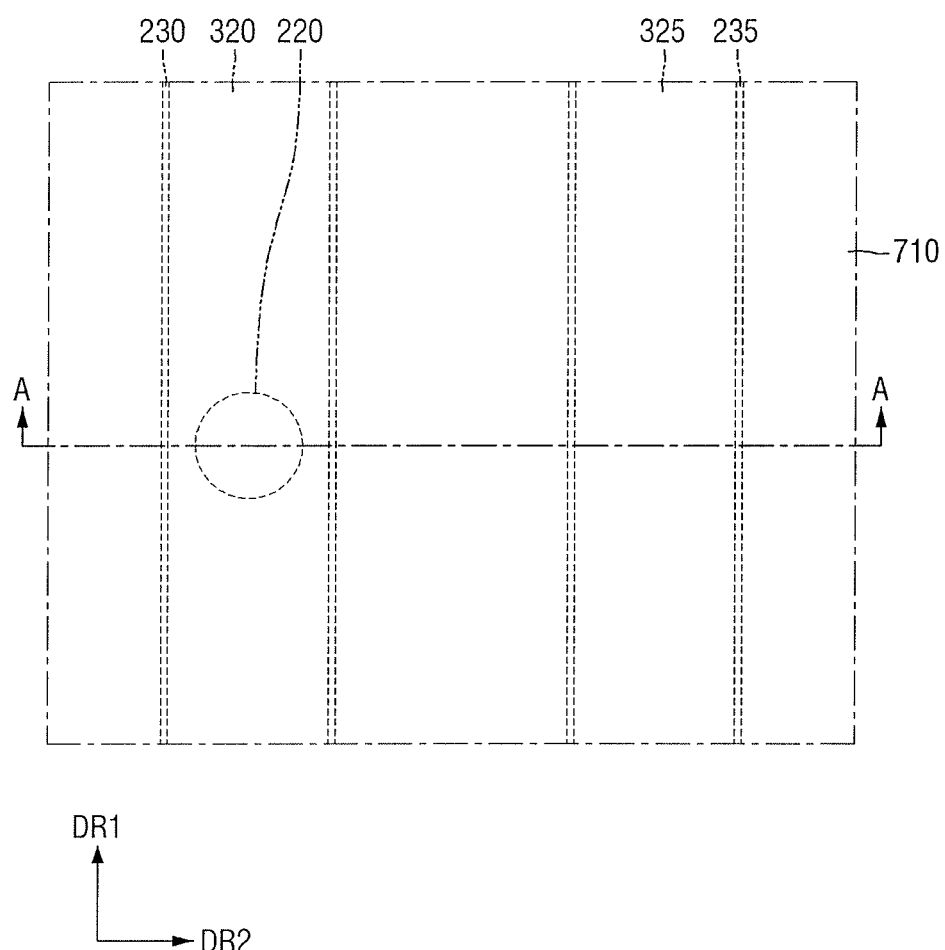
Figure 19:
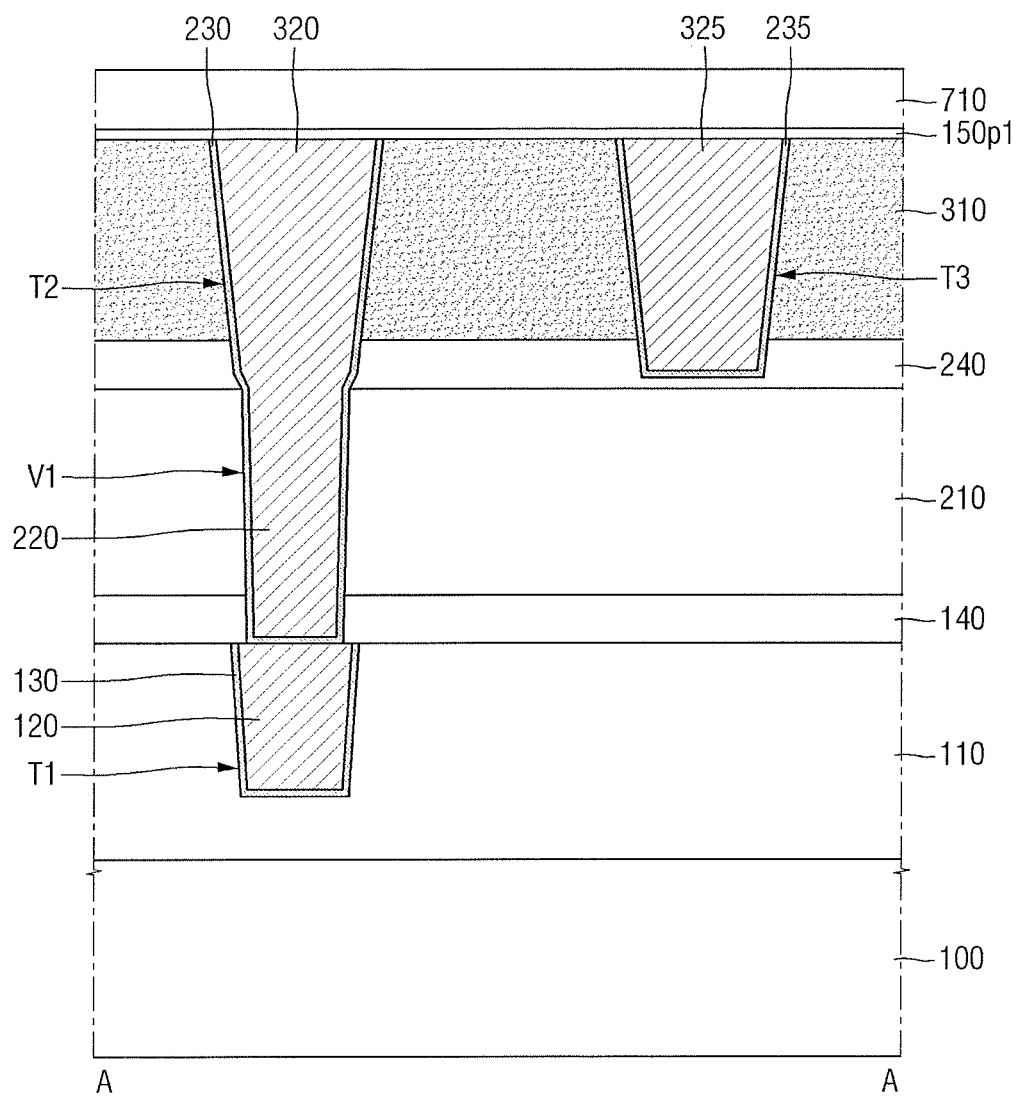

Referring to FIGS. 18 and 19, a first preliminary capping film 150p1 and a patterning film 710 are formed on the third interlayer insulating film 310. For reference, FIG. 19 is a cross-sectional view taken along the line A-A of FIG. 18.

The first preliminary capping film 150p1 may be formed to cover the upper surface of the third interlayer insulating film 310, the upper surface of the second wiring pattern 320, and the upper surface of the third wiring pattern 325. The first preliminary capping film 150p1 may include, e.g., at least one of silicon nitride (SiN), silicon oxynitride (SiON), silicon carbonitride (SiCN), and combinations thereof.

The patterning film 710 may be formed on the first preliminary capping film 150p1. In some embodiments, the patterning film 710 may include a block copolymer (BCP), e.g., the block copolymer (BCP) may include self-assembling block copolymers that are capable of self-organizing into isolated nanometer-scale patterns (e.g., under hear conditions) useable for fabricating nano-scale structural units. For example, the patterning film 710 may include PS-b-PI (polystyrene-block-polyisoprene copolymer), PS-b-PB (polystyrene-block-polybutadiene copolymer), PS-b-PMMA (polystyrene-block-polymethylmethacrylate copolymer), and the like. For convenience of explanation, a patterning film 710 will be described as including PS-b-PMMA below.

Figure 20:
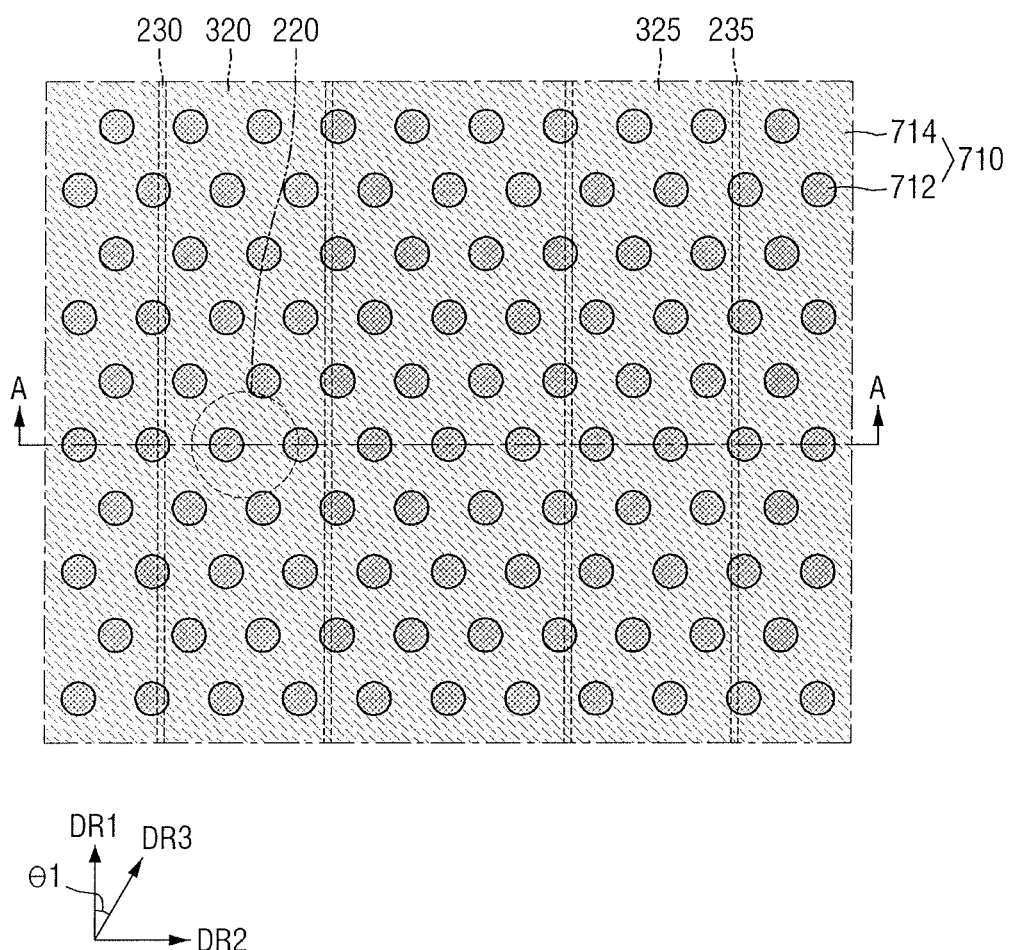
Figure 21:
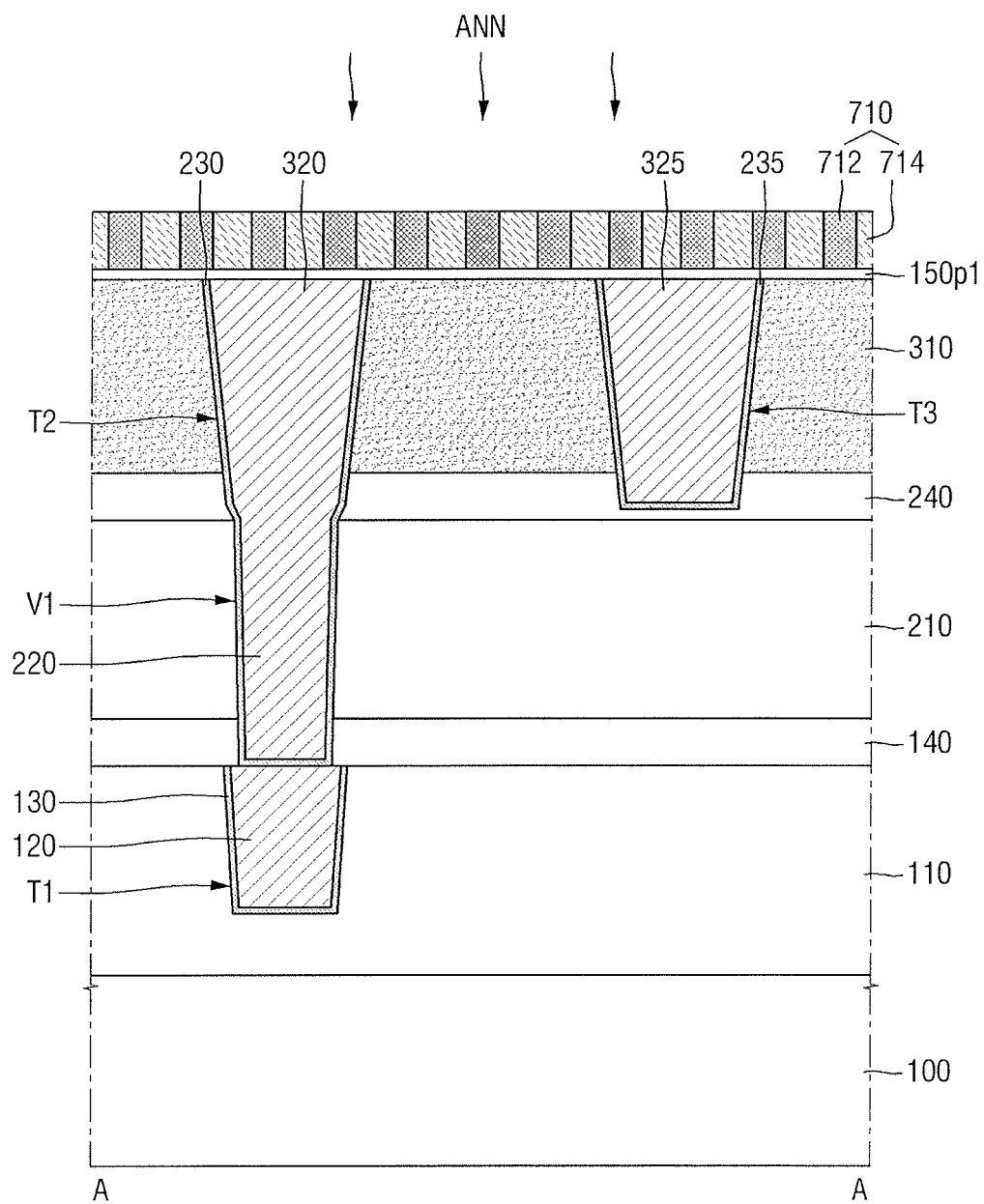

Referring to FIGS. 20 and 21, a film treatment process (ANN) of the patterning film 710 is executed. For reference, FIG. 21 is a cross-sectional view taken along line A-A of FIG. 20.

The film treatment process (ANN) may form a periodic pattern in the patterning film 710. For example, the film treatment process (ANN) may form a first pattern 712 and a second pattern 714 in the patterning film 710, e.g., under a heat treatment process the block copolymers in the patterning film 710 may rearrange into a plurality of cylindrical block components arranged in a matrix pattern having substantially level top surfaces.

In some embodiments, the plurality of first patterns 712 may be arranged in a honeycomb structure from a planar viewpoint, and the second pattern 714 may be arranged to surround the plurality of first patterns 712. Also, in some embodiments, each first pattern 712 may be in the shape of a cylinder, in which a vertical axis intersects the upper surface of the substrate 100. For example, the patterning film 710 may include a block copolymer (BCP) forming a cylindrical copolymer. When the patterning film 710 includes PS-b-PMMA, the first pattern 712 may include PMMA (polymethylmethacrylate), and the second pattern 714 may include PS (polystyrene). The film treatment process (ANN) may include, e.g., an annealing process.

Figure 22:
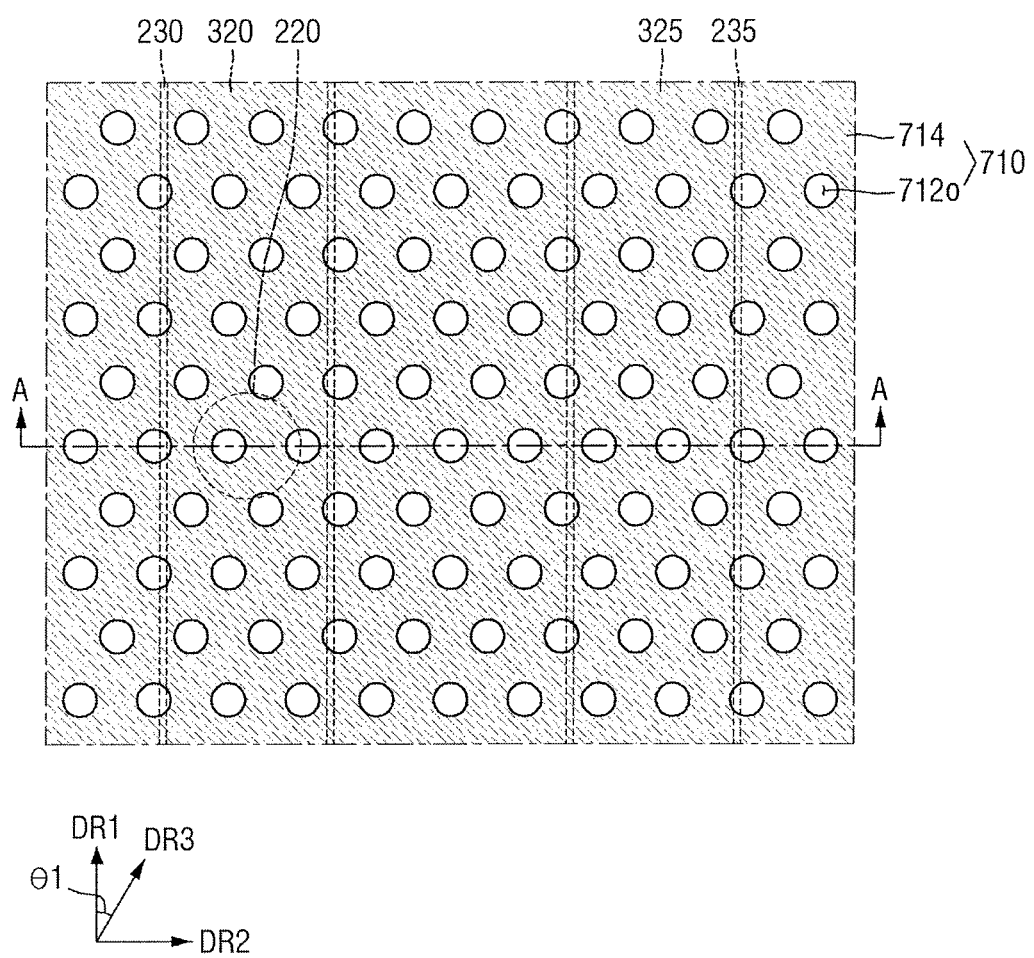
Figure 23:
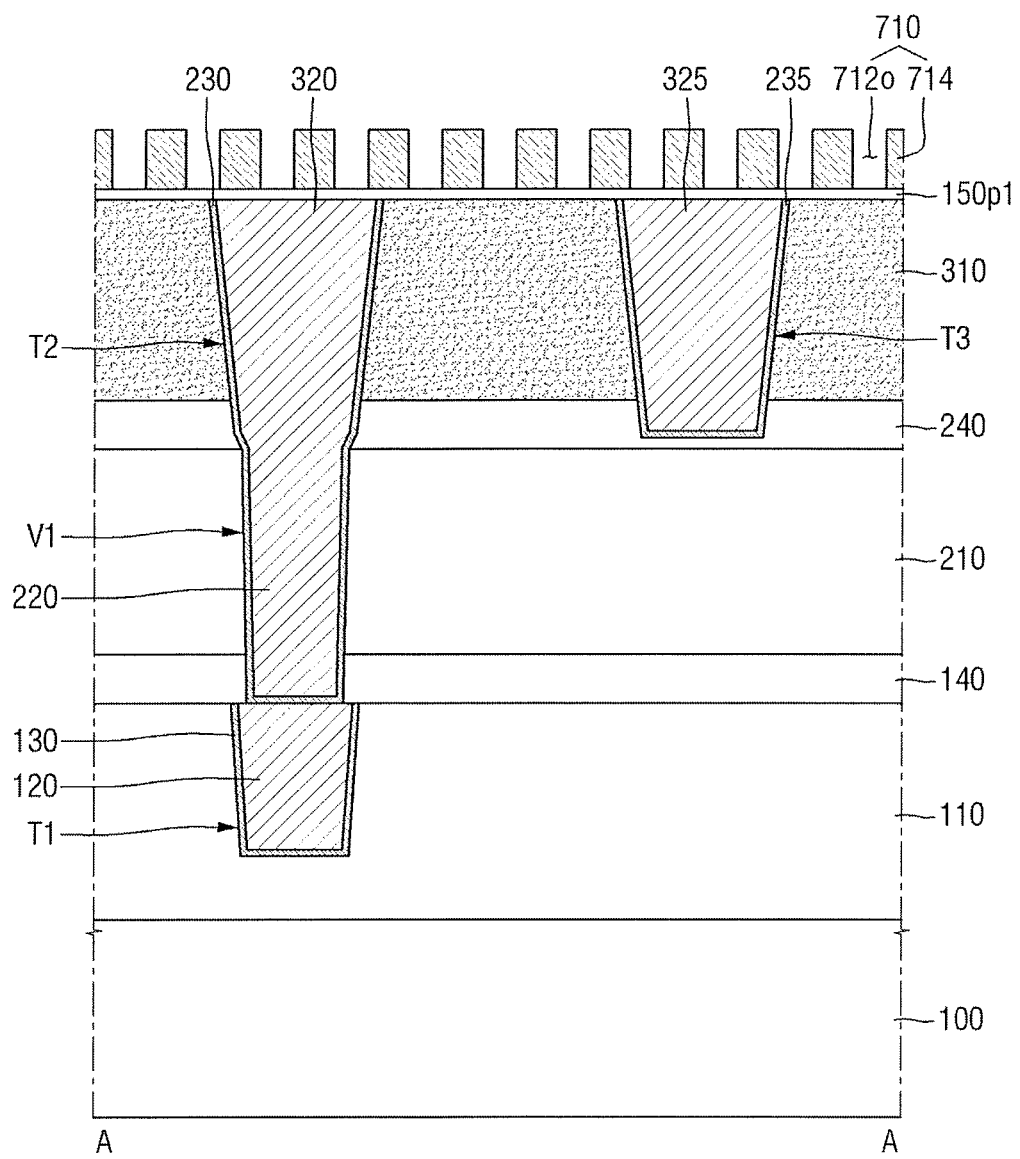

Referring to FIGS. 22 and 23, an opening 712o is formed in the patterning film 710. For reference, FIG. 23 is a cross-sectional view taken along line A-A of FIG. 22.

For example, the first pattern 712 of the patterning film 710 may be selectively removed. For example, the first pattern 712 may be selectively removed, by the etching process in which an etching rate of the first pattern 712 is larger than that of the second pattern 714. Also, the second pattern 714 may remain on the first preliminary capping film 150p1.

As a result, a plurality of openings 712o arranged in the same manner as the plurality of first patterns 712 may be formed in the patterning film 710. In some embodiments, the plurality of openings 712o may be arranged in a honeycomb structure from a planar viewpoint.

Figure 24:
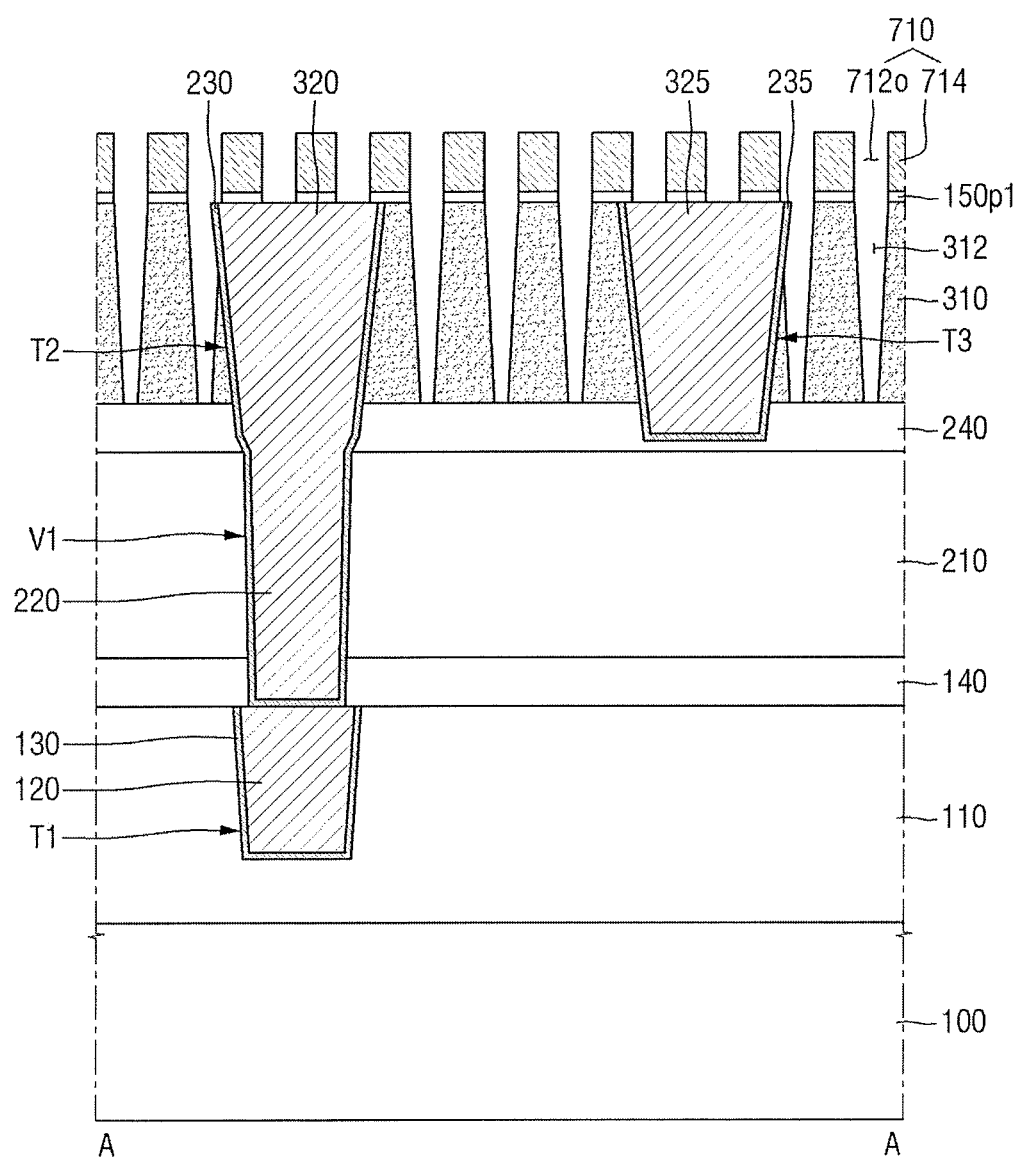

Referring to FIG. 24, the plurality of air gaps 312 is formed in the third interlayer insulating film 310.

For example, the plurality of air gaps 312 which sequentially penetrate the first preliminary capping film 150p1 and the third interlayer insulating film 310 may be formed, by an etching process which uses the patterning film 710 (i.e., the second pattern 714) as an etching mask. The etching process may include, e.g., a dry etching process. In some embodiments, the plurality of air gaps 312 may be arranged in a honeycomb structure from a planar viewpoint.

Subsequently, referring to FIG. 2, the first capping film 150 is formed on the third interlayer insulating film 310. The first capping film 150 may cover the upper surface of the third interlayer insulating film 310, the upper surface of the second wiring pattern 320, and the upper surface of the third wiring pattern 325. Also, the first capping film 150 may cover the upper part of the plurality of air gaps 312. For example, the first capping film 150 may be formed by forming a material having poor step coverage on the first preliminary capping film 150p1. The first capping film 150 may include, e.g., at least one of silicon nitride (SiN), silicon oxynitride (SiON), silicon carbonitride (SiCN), and combinations thereof.

Figure 25:
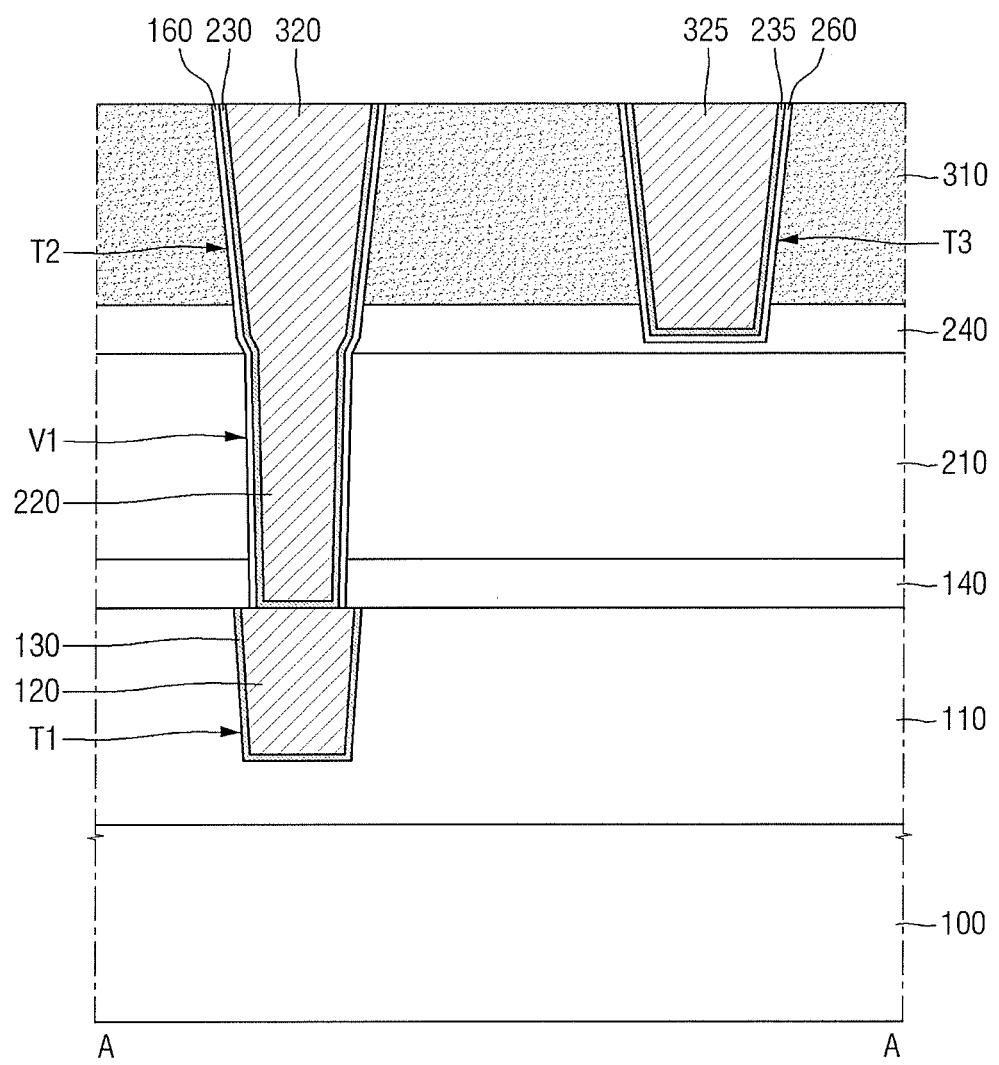
FIG. 25 illustrate stages in a method for fabricating a semiconductor device according to some embodiments.

FIG. 25 is an intermediate step diagram for explaining a method for fabricating a semiconductor device according to some embodiments. For the sake of convenience of explanation, repeated parts of those described with reference to FIGS. 1A to 24 will be only briefly described or omitted. For reference, FIG. 25 is a diagram for explaining a step after FIG. 16.

Referring to FIG. 25, the first protective film 160 and the second protective film 260 are formed, before forming the second barrier conductive film 230 and the third barrier conductive film 235.

The first protective film 160 may extend along the sidewalls of the first via hole V1 and the sidewalls of the second trench T2. The second protective film 260 may extend along the sidewalls of the third trench T3. The first protective film 160 and the second protective film 260 may include, e.g., at least one of silicon nitride (SiN), silicon oxynitride (SiON), silicon carbonitride (SiCN), and combinations thereof.

Subsequently, the above-described steps may be executed with reference to FIGS. 18 to 24. Therefore, the semiconductor device of FIG. 5 may be fabricated.

Figure 26:
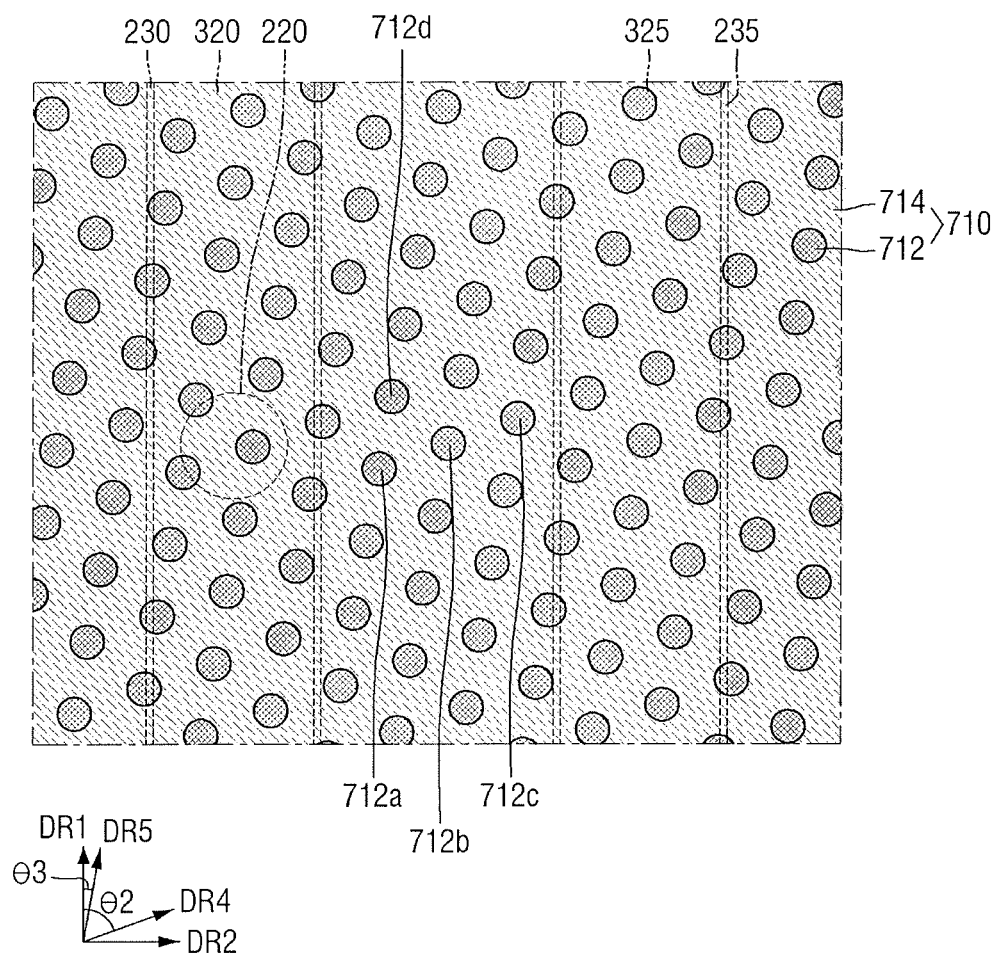
FIG. 26 illustrate a stage in a method for fabricating a semiconductor device according to some embodiments.

FIG. 26 is an intermediate step diagram for explaining a method for fabricating a semiconductor device according to some embodiments. For the sake of convenience of explanation, repeated parts of those described using FIGS. 1A to 24 will be only briefly described or omitted. For reference, FIG. 26 is a diagram for explaining a step after FIG. 19.

Referring to FIG. 26, a part of the first pattern 712 arranged in one row among the plurality of first patterns 712 intersects the direction in which the second wiring pattern 320 extends.

For example, the first pattern 712 may include first to fourth sub-patterns 712a, 712b, 712c and 712d arranged in a honeycomb structure from a planar viewpoint. The first to third sub-patterns 712a, 712b and 712c may be arranged along the fourth direction DR4. A fourth sub-pattern 712d is arranged with the first sub-pattern 712a along the fifth direction DR5.

In some embodiments, a fourth direction DR4 in which the first sub-pattern 712a and the second sub-pattern 712b are arranged may form an acute angle θ2 with the first direction DR1 in which the second wiring pattern 320 extends. Further, e.g., a fifth direction DR5 in which the first air gap G1 and the fourth air gap G4 are arranged may form an acute angle θ3 with the first direction DR1 in which the second wiring pattern 320 extends.

Subsequently, the above-described steps may be executed using FIGS. 22 to 24. Therefore, the semiconductor device of FIG. 8 may be fabricated.

Figure 27:
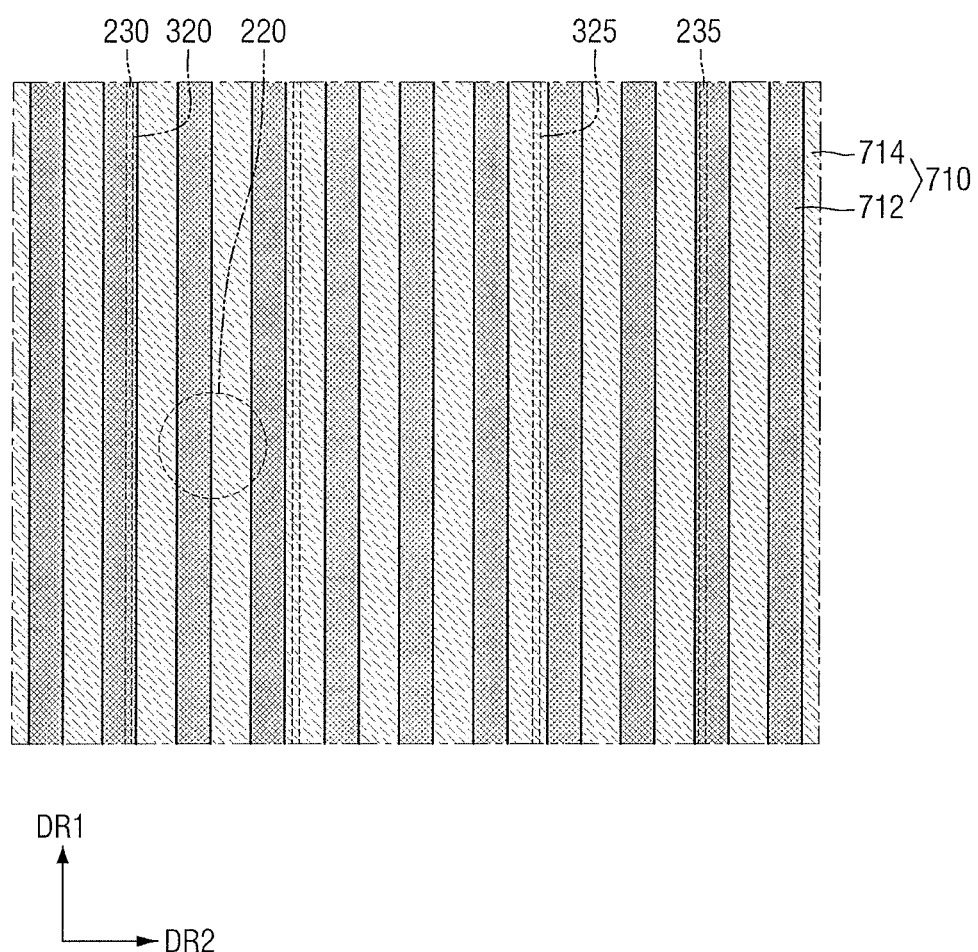
FIG. 27 illustrate a stage in a method for fabricating a semiconductor device according to some embodiments.

FIG. 27 is an intermediate step diagram for explaining a method for fabricating a semiconductor device according to some embodiments. For the sake of convenience of explanation, repeated parts of those described using FIGS. 1A to 24 will be only briefly described or omitted. For reference, FIG. 27 is a diagram for explaining a step after FIG. 19.

Referring to FIG. 27, the first pattern 712 and the second pattern 714 are alternately arranged and extend long in one direction, respectively.

For example, the first pattern 712 and the second pattern 714 may be arranged alternately along the second direction DR2. Also, e.g., each of the first patterns 712 and each of the second patterns 714 may extend long in the first direction DR1.

In some embodiments, the patterning film 710 may include a block copolymer (BCP) forming a lamellar copolymer. When the patterning film 710 includes PS-b-PMMA, the first pattern 712 may include PMMA (polymethylmethacrylate), and the second pattern 714 may include PS (polystyrene).

Subsequently, the above-described steps may be executed using FIGS. 22 to 24. Therefore, the semiconductor device of FIG. 9 may be fabricated.

Figure 28:
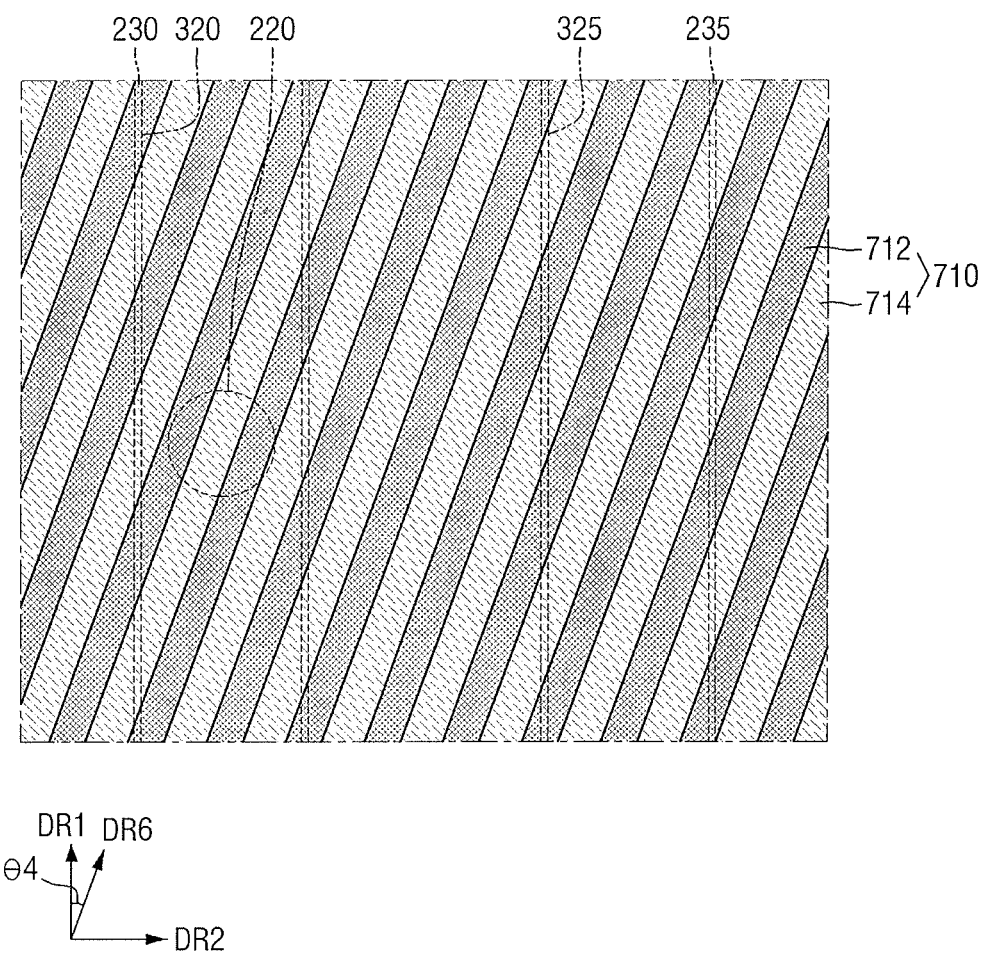
FIG. 28 illustrate a stage in a method for fabricating a semiconductor device according to some embodiments.

FIG. 28 is an intermediate step diagram illustrating a method for fabricating a semiconductor device according to some embodiments. For the sake of convenience of explanation, repeated parts of those described using FIGS. 1A to 24 and 27 will be only briefly described or omitted. For reference, FIG. 28 is a diagram for explaining a step after FIG. 19.

Referring to FIG. 28, each first pattern 712 and each second pattern 714 extending long in one direction intersect with the direction in which the second wiring pattern 320 extends.

For example, a sixth direction DR6 in which each first pattern 712 and each second pattern 714 extend may form an acute angle θ4 with the first direction DR1 in which the second wiring pattern 320 extends. The sixth direction DR6 is only illustrated as forming an acute angle with the first direction DR1, but this is merely an example, and the sixth direction DR6 may, of course, form a right angle or obtuse angle with the first direction DR1.

Figure 29:
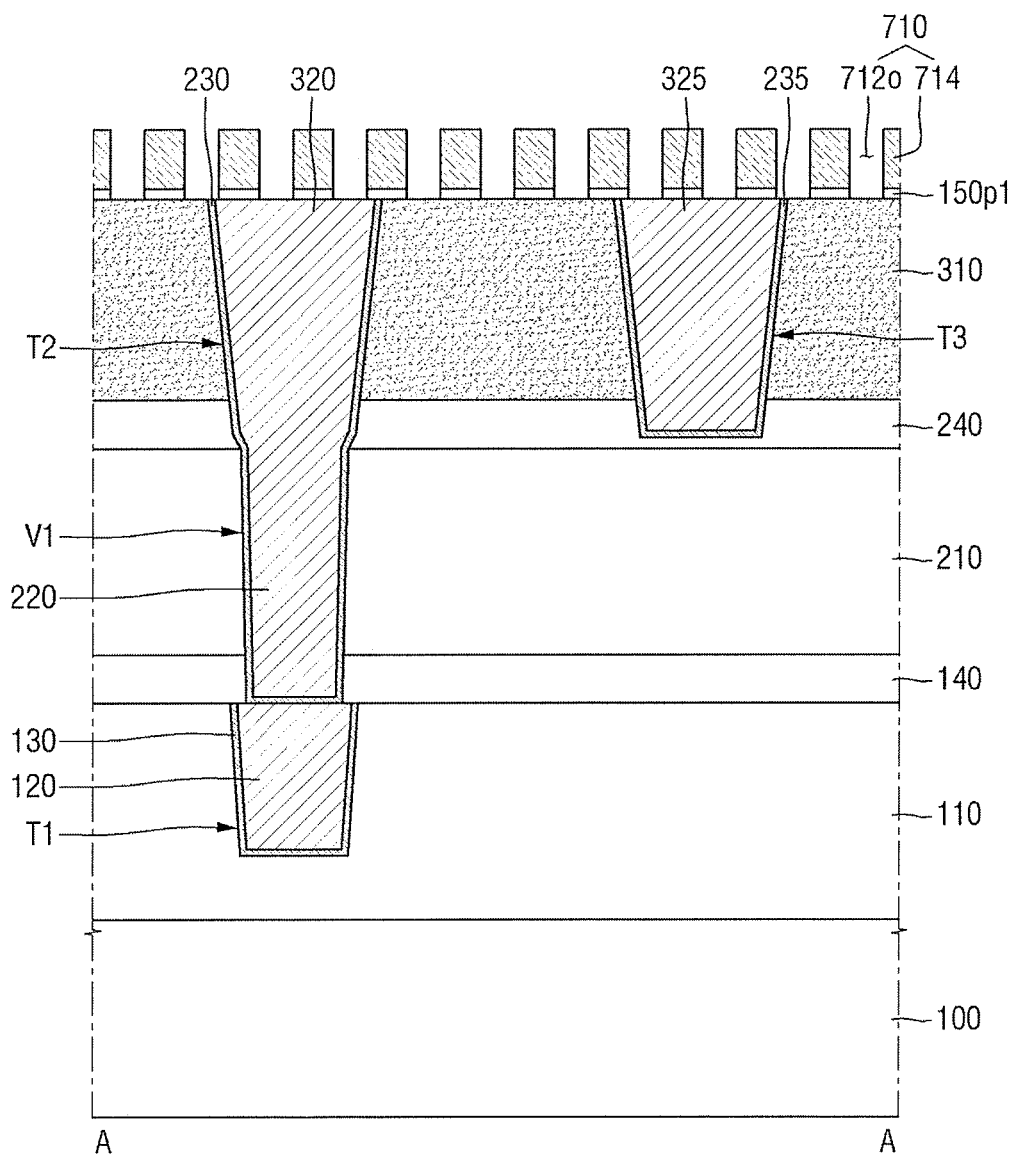
FIGS. 29 to 34 illustrate stages in a method for fabricating a semiconductor device according to some embodiments.

FIGS. 29 to 34 are intermediate step diagrams for explaining a method for fabricating a semiconductor device according to some embodiments. For the sake of convenience of explanation, repeated parts of those described using FIGS. 1A to 24 will be only briefly described or omitted. For reference, FIG. 29 is a diagram for explaining the step after FIG. 23.

Referring to FIG. 29, the first preliminary capping film 150p1 is patterned, using the patterning film 710.

For example, the first preliminary capping film 150p1 may be patterned, by an etching process which uses the patterning film 710 (i.e., the second pattern 714) as an etching mask. As a result, the patterned first preliminary capping film 150p1 may expose a part of the third interlayer insulating film 310.

Figure 30:
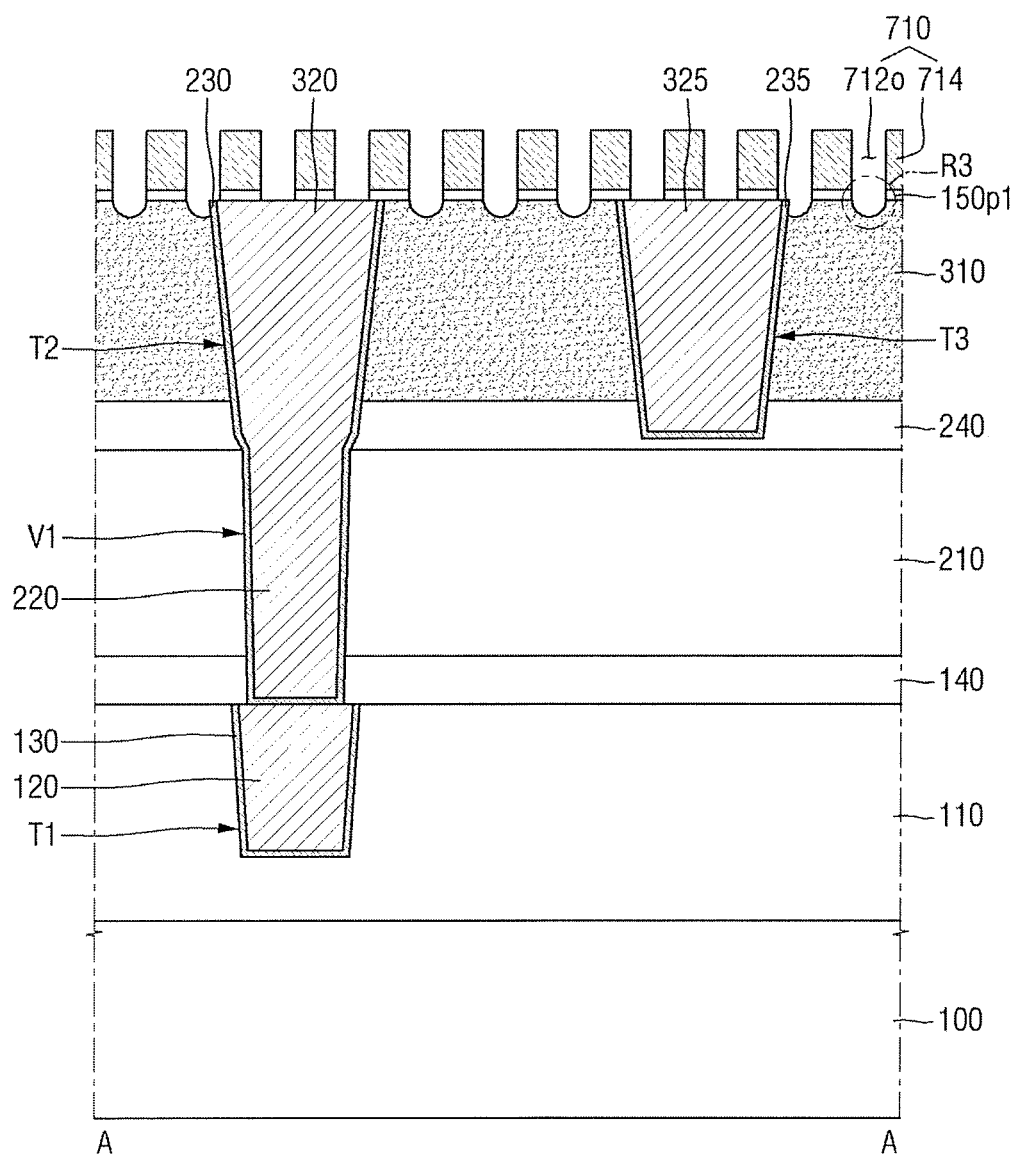
Figure 31:
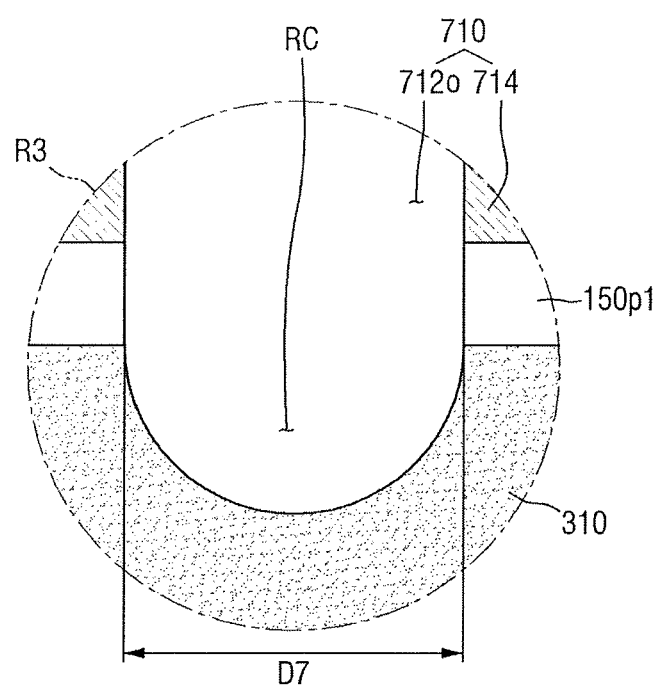

Referring to FIGS. 30 and 31, a part of the third interlayer insulating film 310 is etched, using the patterned first preliminary capping film 150p1. For reference, FIG. 31 is an exemplary enlarged view which enlarges a region R3 of FIG. 30.

For example, a recess RC may be formed in the third interlayer insulating film 310, by an etching process which uses the patterning film 710 and/or the first preliminary capping film 150p1 as an etching mask. The recess RC may be used, e.g., to facilitate formation of the air gap 312 in the third interlayer insulating film 310.

Figure 32:
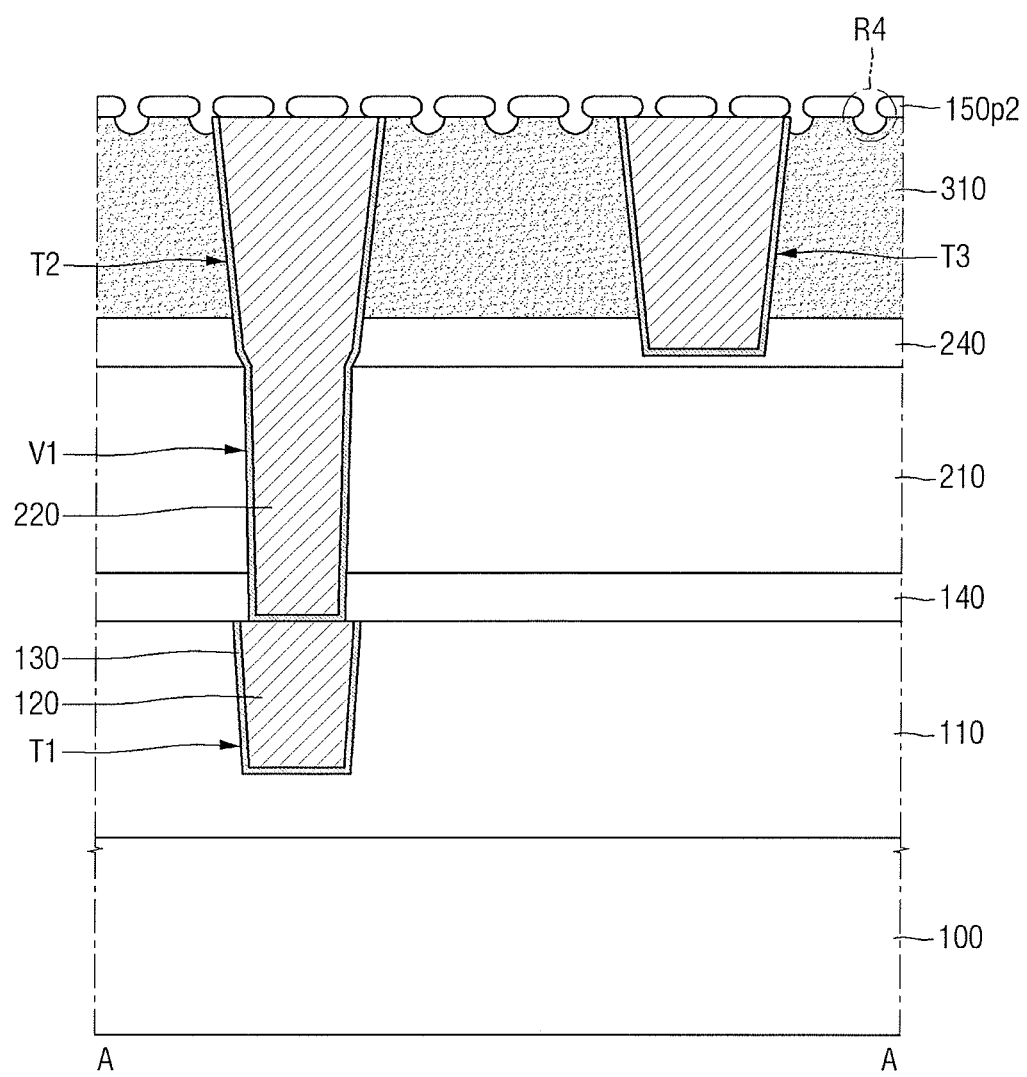
Figure 33:
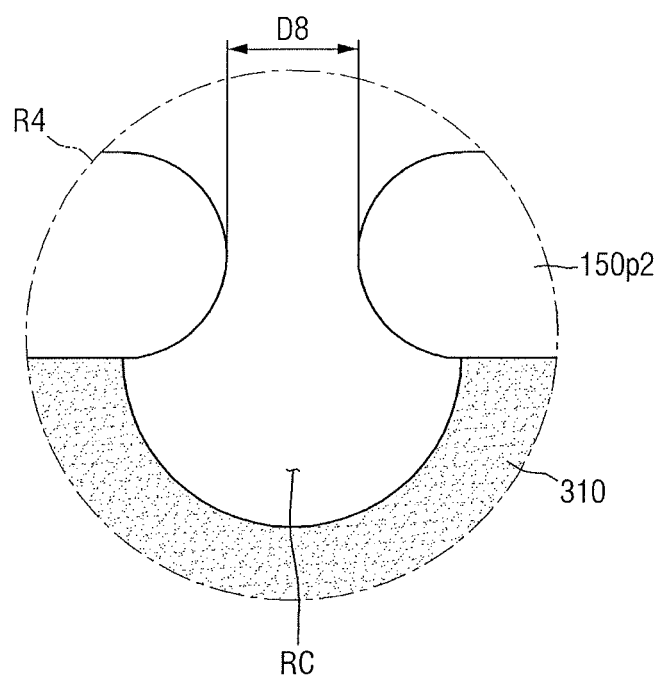

Referring to FIGS. 32 and 33, a second preliminary capping film 150p2 is formed on the third interlayer insulating film 310. For reference, FIG. 33 is an exemplary enlarged view which enlarges a region R4 of FIG. 32.

For example, a second preliminary capping film 150p2 may be formed by forming a material having poor step coverage on the first preliminary capping film 150p1. Accordingly, the second preliminary capping film 150p2 may include an opening having a width smaller than that of the patterned first preliminary capping film 150p1. For example, a width D8 of the opening of the second preliminary capping film 150p2 may be smaller than the width of the opening of the first preliminary capping film 150p1 (D7 of FIG. 31).

A second preliminary capping film 150p2 may be used, e.g., to facilitate the formation of the first capping film 150 on the third interlayer insulating film 310. The second preliminary capping film 150p2 may include, e.g., at least one of silicon nitride (SiN), silicon oxynitride (SiON), silicon carbonitride (SiCN), and combinations thereof.

Figure 34:
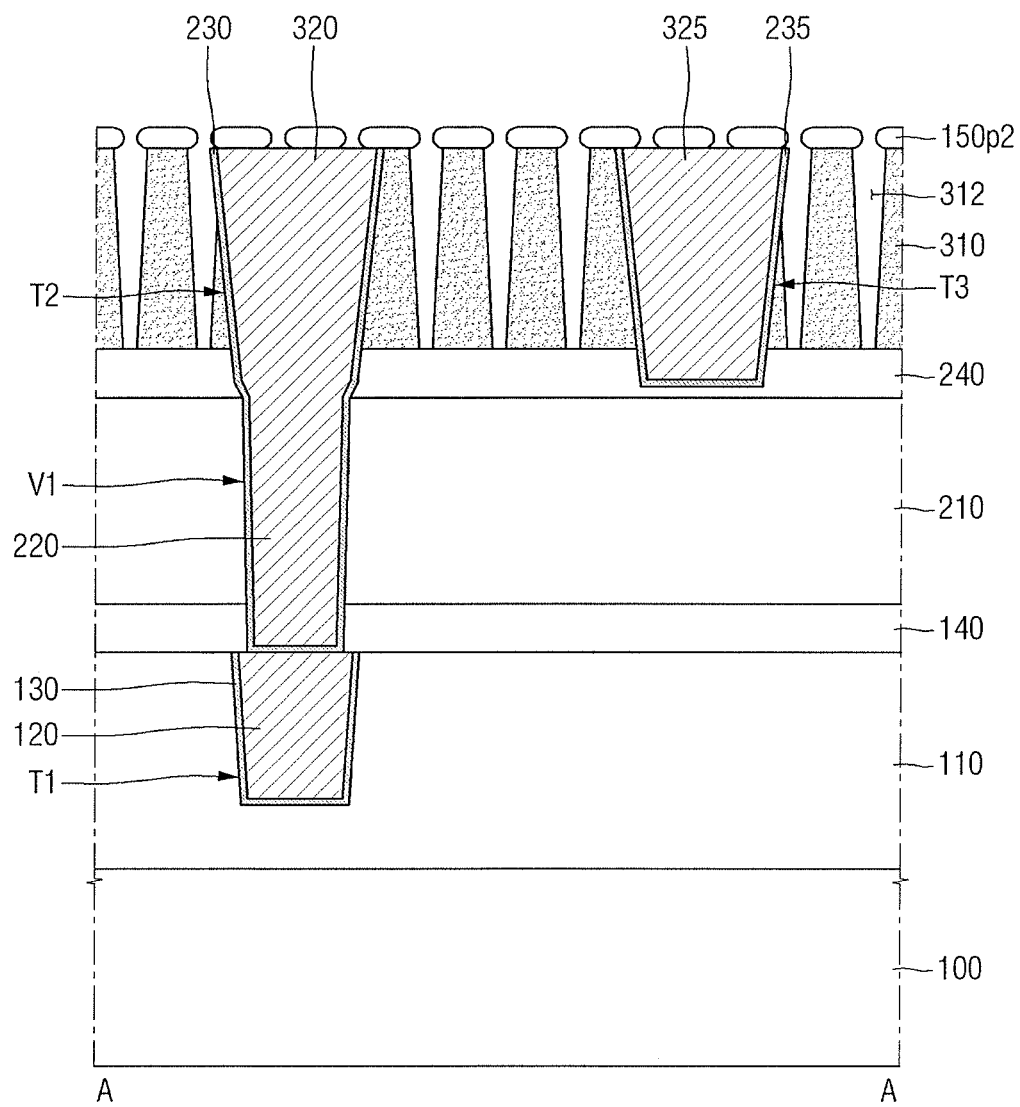

Referring to FIG. 34, the plurality of air gaps 312 is formed in the third interlayer insulating film 310. For example, the plurality of air gaps 312 penetrating the third interlayer insulating film 310 may be formed, by an etching process which uses the second preliminary capping film 150p2 as an etching mask.

Subsequently, referring to FIG. 2, the first capping film 150 is formed on the third interlayer insulating film 310. The first capping film 150 may cover the upper surface of the third interlayer insulating film 310, the upper surface of the second wiring pattern 320, and the upper surface of the third wiring pattern 325. Also, the first capping film 150 may cover the upper parts of the plurality of air gaps 312. For example, the first capping film 150 may be formed by forming a material having poor step coverage on the second preliminary capping film 150p2.

By way of summation and review, aspects of embodiments provide a semiconductor device with improved product reliability and performance. Aspects of embodiments also provide a method for fabricating a semiconductor device capable of fabricating the semiconductor device with improved product reliability and performance.

That is, according to embodiments, an interlayer insulating film may be firmly supported by using a plurality of periodically arranged air gaps therein, so the coupling phenomenon between the wirings can be reduced. Further, as the plurality of air gaps does not extend to an underlying interlayer insulating film, in which vias are formed, the interlayer insulating film is further supported.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a semiconductor device, the method comprising:
   sequentially forming a first interlayer insulating film on a substrate, a first wiring pattern in the first interlayer insulating film, a first etching stop film on the first interlayer insulating film, and a second interlayer insulating film on the first etching stop film;
   forming a via and a second wiring pattern, such that the via penetrates the first interlayer insulating film, and the second wiring pattern penetrates the first etching stop film and the second interlayer insulating film to connect to the via;
   forming a plurality of air gaps periodically arranged in the second interlayer insulating film; and
   forming a capping film which covers an upper surface of the second interlayer insulating film and an upper surface of the second wiring pattern, such that the capping film defines an upper part of each of the air gaps.

2. The method for fabricating the semiconductor device as claimed in claim 1, wherein forming the plurality of air gaps includes:
   forming a patterning film including a block copolymer (BCP) on the second interlayer insulating film; and
   forming the plurality of air gaps in the second interlayer insulating film, using the patterning film.

3. The method for fabricating the semiconductor device as claimed in claim 2, wherein the patterning film is formed to include a first pattern and a second pattern, the first pattern being arranged in a honeycomb structure from a planar viewpoint, and the second pattern being arranged to surround the first pattern.

4. The method for fabricating the semiconductor device as claimed in claim 3, wherein the first pattern includes PMMA (polymethylmethacrylate), and the second pattern includes PS (polystyrene).

5. The method for fabricating the semiconductor device as claimed in claim 3, wherein:
   the first pattern includes a first to fourth sub-patterns, the first to third sub-patterns being arranged along a first direction, and the fourth sub-pattern being arranged with the first sub-pattern along a second direction intersecting the first direction, and
   the second wiring pattern extends along a third direction which is intersecting the first direction and the second direction.

6. The method for fabricating the semiconductor device as claimed in claim 5, wherein the third direction is not perpendicular to the first and second directions.

7. The method for fabricating the semiconductor device as claimed in claim 3, wherein the first pattern and the second pattern are alternately arranged and extend lengthwise in one direction, respectively.

8. The method for fabricating the semiconductor device as claimed in claim 7, wherein the first pattern and the second pattern extend lengthwise in a first direction, and the second wiring pattern extends lengthwise in a second direction intersecting the first direction.

9. The method for fabricating the semiconductor device as claimed in claim 7, wherein the first pattern and the second pattern extend lengthwise in a first direction, and the second wiring pattern extends lengthwise in the first direction.

10. The method for fabricating the semiconductor device as claimed in claim 1, wherein the plurality of air gaps is arranged in a honeycomb structure from a planar viewpoint.

11. The method for fabricating the semiconductor device as claimed in claim 1, wherein each of the plurality of air gaps has a cylindrical shape in which an axis extends from the first etching stop film to the capping film.

12. The method for fabricating the semiconductor device as claimed in claim 1, wherein each of the plurality of air gaps extends in a first direction parallel to an upper surface of the substrate.

13. The method for fabricating the semiconductor device as claimed in claim 1, wherein the plurality of air gaps includes first to third air gaps, a spaced distance between the first air gap and the second air gap being equal to a spaced distance between the second air gap and the third air gap.

14. The method for fabricating the semiconductor device as claimed in claim 13, wherein the first to third air gaps are arranged in an equilateral triangular structure from a planar viewpoint.

15. A method for fabricating a semiconductor device, the method comprising:
   sequentially forming a first interlayer insulating film on a substrate, a first wiring pattern in the first interlayer insulating film, a first etching stop film on the first interlayer insulating film, and a second interlayer insulating film on the first etching stop film;
   forming a via and a second wiring pattern, such that the via penetrates the first interlayer insulating film, and the second wiring pattern penetrates the first etching stop film and the second interlayer insulating film to connect to the via;
   etching a portion of the second interlayer insulating film to form a recess; and
   forming a preliminary capping film on the second interlayer insulating film, such that at least a portion of the preliminary capping film overlaps the recess in a vertical direction.

16. The method for fabricating the semiconductor device as claimed in claim 15, further comprising forming a plurality of air gaps periodically arranged in the second interlayer insulating film using the recess and the preliminary capping film.

17. The method for fabricating the semiconductor device as claimed in claim 15, wherein a maximum width of the recess is greater than a width between adjacent patterns of the preliminary capping film.

18. A method for fabricating a semiconductor device, the method comprising:

sequentially forming a first interlayer insulating film on a substrate, a first wiring pattern in the first interlayer insulating film, a first etching stop film on the first interlayer insulating film, and a second interlayer insulating film on the first etching stop film;

forming a via and a second wiring pattern, such that the via penetrates the first interlayer insulating film, and the second wiring pattern penetrates the first etching stop film and the second interlayer insulating film to connect to the via;

forming a recess in the second interlayer insulating film;

forming a preliminary capping film overlapping with the recess on the second interlayer insulating film;

forming a plurality of air gaps periodically arranged in the second interlayer insulating film using the recess and the preliminary capping film; and forming a capping film which covers an upper surface of the second interlayer insulating film and an upper surface of the second wiring pattern, such that the capping film defines an upper part of each of the plurality of air gaps.

19. The method for fabricating the semiconductor device as claimed in claim 18, wherein forming the plurality of air gaps includes:

forming a patterning film including a block copolymer (BCP) on the second interlayer insulating film; and forming the plurality of air gaps in the second interlayer insulating film, using the patterning film.

20. The method for fabricating the semiconductor device as claimed in claim 19, wherein a maximum width of the recess is greater than a width between adjacent patterns of the preliminary capping film.

* * * * *